(12) United States Patent
Seo et al.

(10) Patent No.: US 12,238,931 B2
(45) Date of Patent: Feb. 25, 2025

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Jae Hwa Seo, Seoul (KR); Hakseon Kim, Seoul (KR); Sungkweon Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 563 days.

(21) Appl. No.: 17/387,868

(22) Filed: Jul. 28, 2021

(65) Prior Publication Data

US 2022/0208783 A1 Jun. 30, 2022

(30) Foreign Application Priority Data

Dec. 24, 2020 (KR) ........................ 10-2020-0183484

(51) Int. Cl.
| | |
|---|---|
| *H10B 43/40* | (2023.01) |
| *H10B 41/27* | (2023.01) |
| *H10B 41/41* | (2023.01) |
| *H10B 43/27* | (2023.01) |

(52) U.S. Cl.
CPC ............. *H10B 43/40* (2023.02); *H10B 41/27* (2023.02); *H10B 41/41* (2023.02); *H10B 43/27* (2023.02)

(58) Field of Classification Search
CPC ........ H10B 43/40; H10B 41/27; H10B 41/41; H10B 43/27; H10B 43/50; H01L 27/088; H01L 21/823462; H01L 21/823475; H01L 21/823418; H01L 21/823481
See application file for complete search history.

(56) References Cited

U.S. PATENT DOCUMENTS

| | | | | |
|---|---|---|---|---|
| 7,772,108 | B2 * | 8/2010 | Son | H10B 41/49 257/E21.585 |
| 8,053,307 | B2 * | 11/2011 | Seo | H01L 29/7834 438/242 |
| 8,928,090 | B2 | 1/2015 | Seo et al. | |
| 9,178,045 | B2 * | 11/2015 | Obradovic | H01L 21/30604 |
| 9,190,410 | B2 | 11/2015 | Lee et al. | |
| 9,799,524 | B2 | 10/2017 | Ito et al. | |

(Continued)

FOREIGN PATENT DOCUMENTS

| | | |
|---|---|---|
| KR | 100487564 B1 | 5/2005 |
| KR | 101721036 B1 | 3/2017 |

*Primary Examiner* — Kyoung Lee
*Assistant Examiner* — Sophia W Kao
(74) *Attorney, Agent, or Firm* — Muir Patent Law, PLLC

(57) ABSTRACT

A semiconductor device and an electronic system including the same are disclosed. The semiconductor device may include a gate electrode on a semiconductor substrate, a gate insulating layer between the gate electrode and the semiconductor substrate, a first epitaxial layer disposed on the semiconductor substrate and at a side of the gate electrode, a second epitaxial layer disposed on the semiconductor substrate and at an opposite side of the gate electrode, a first contact plug in contact with a portion of the first epitaxial layer, and a second contact plug in contact with a portion of the second epitaxial layer. Top surfaces of the first and second epitaxial layers may be located at a level higher than a top surface of the gate electrode.

20 Claims, 26 Drawing Sheets

(56) References Cited

U.S. PATENT DOCUMENTS

| | | | |
|---|---|---|---|
| 9,859,422 B2 | 1/2018 | Nishikawa et al. | |
| 10,090,392 B2 | 10/2018 | Chen et al. | |
| 10,319,827 B2 | 6/2019 | Smith et al. | |
| 10,770,459 B2 | 9/2020 | Iwata et al. | |
| 11,600,609 B2 * | 3/2023 | Sung | H01L 25/18 |
| 2004/0155297 A1 * | 8/2004 | Ariyoshi | H01L 21/76897 |
| | | | 257/E21.507 |
| 2012/0034746 A1 | 2/2012 | Son et al. | |
| 2016/0260712 A1 | 9/2016 | Yagishita | |
| 2016/0351709 A1 * | 12/2016 | Nishikawa | H01L 27/0922 |
| 2017/0338343 A1 | 11/2017 | Baudot et al. | |
| 2019/0296012 A1 * | 9/2019 | Iwata | H01L 21/76834 |

\* cited by examiner

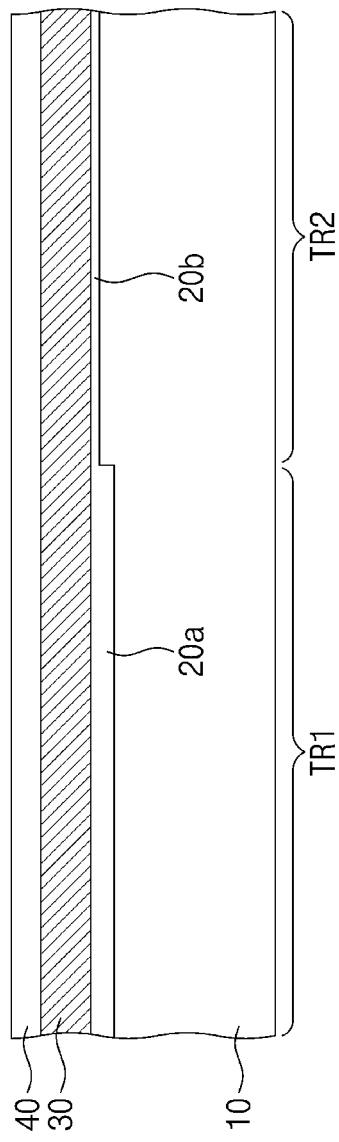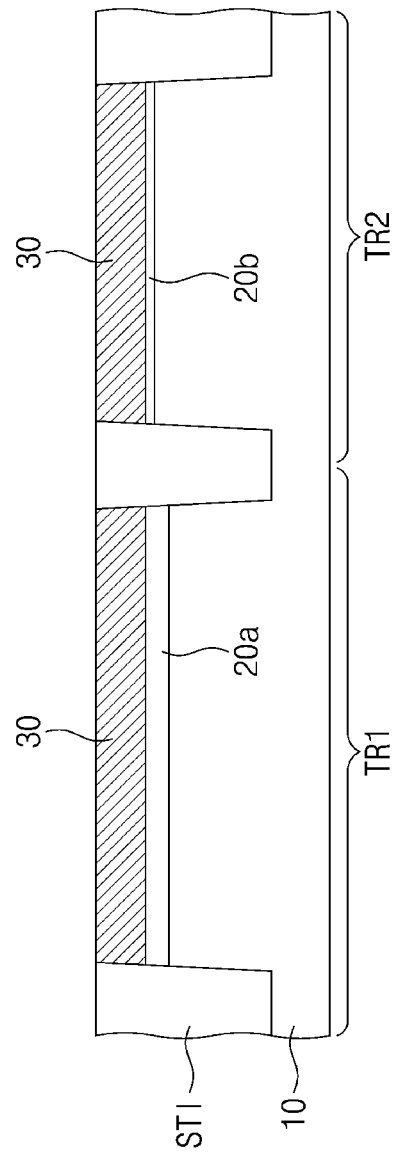

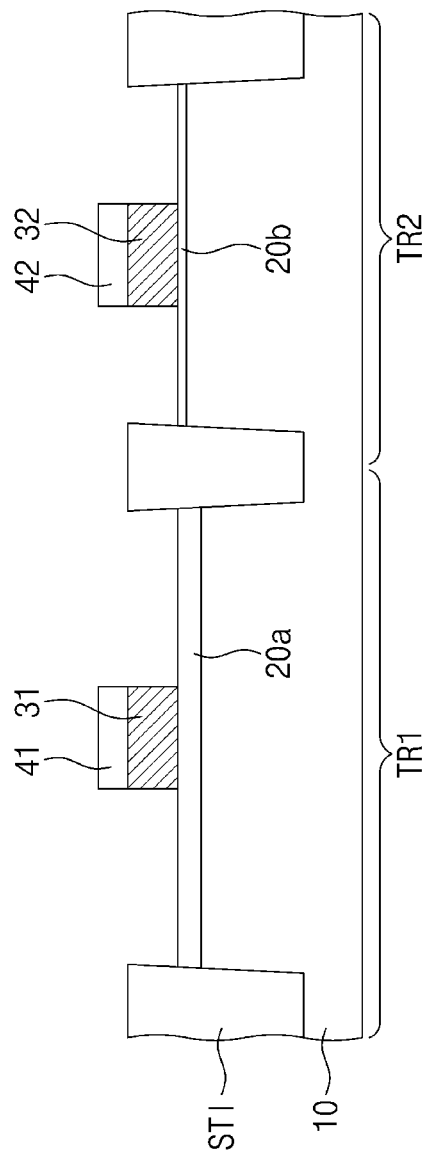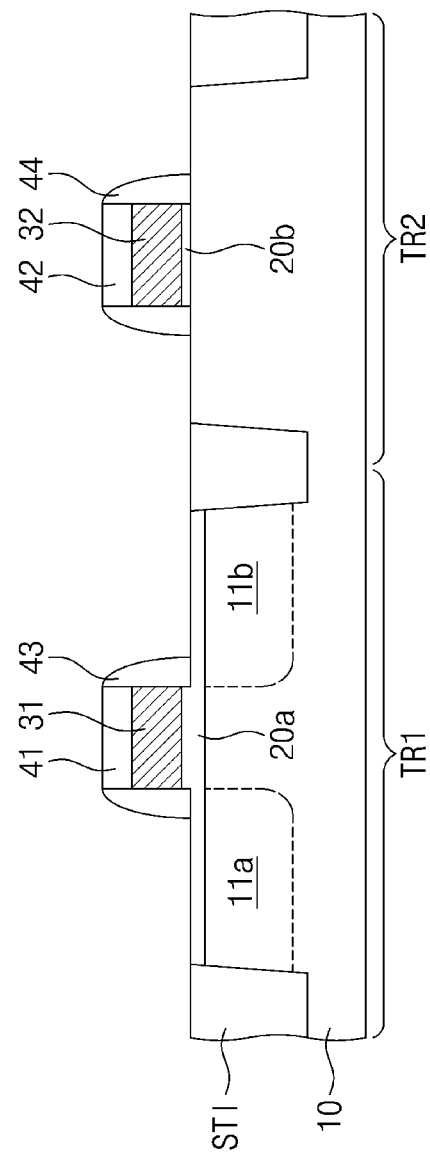

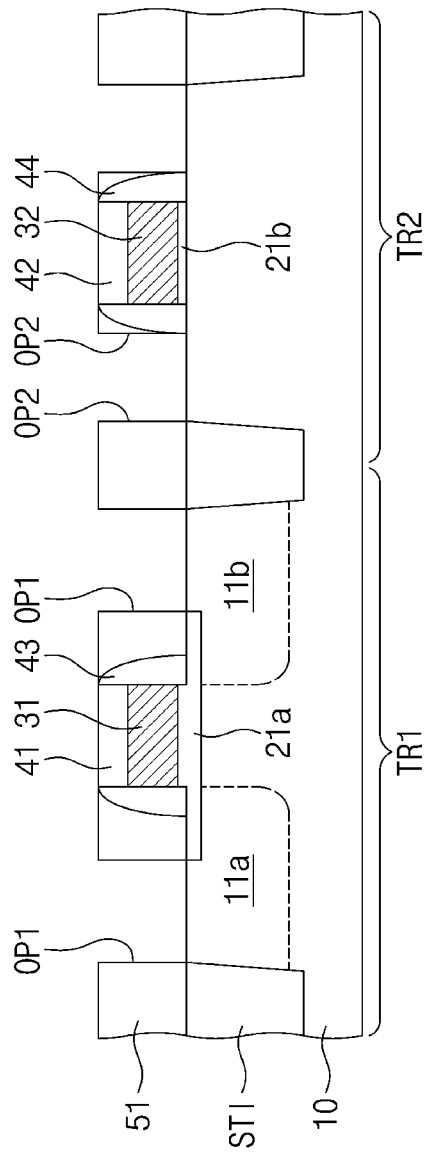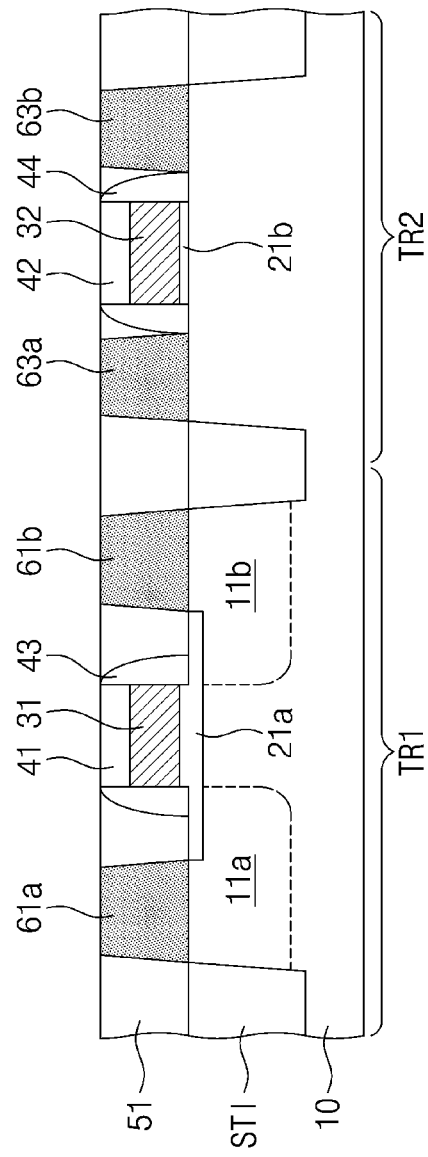

SEMICONDUCTOR DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2020-0183484, filed on Dec. 24, 2020, in the Korean Intellectual Property Office, the entire contents of which are hereby incorporated by reference.

BACKGROUND

The present disclosure relates to a semiconductor device and an electronic system including the same.

A semiconductor device capable of storing a large capacity of data is used as a part of an electronic system. Accordingly, many studies are being conducted to increase the data storage capacity of the semiconductor device. For example, semiconductor devices, in which memory cells are three-dimensionally arranged, are being suggested.

SUMMARY

An embodiment of the inventive concept provides a semiconductor device with improved reliability and an increased integration density.

An embodiment of the inventive concept provides an electronic system including a semiconductor device.

According to an embodiment of the inventive concept, a semiconductor device may include a gate electrode on a semiconductor substrate, a gate insulating layer between the gate electrode and the semiconductor substrate, a first epitaxial layer disposed on the semiconductor substrate and at a first side of the gate electrode, a second epitaxial layer disposed on the semiconductor substrate and at a second side, opposite to the first side, of the gate electrode, a first contact plug in contact with a first portion of the first epitaxial layer, and a second contact plug in contact with a second portion of the second epitaxial layer. Top surfaces of the first and second epitaxial layers may be located at a level higher than a top surface of the gate electrode.

According to an embodiment of the inventive concept, a semiconductor device may include a device isolation layer provided in a semiconductor substrate to define an active region, a gate electrode crossing the active region, a first gate insulating layer between the gate electrode and the semiconductor substrate, a first impurity layer disposed at a side of the gate electrode, a second impurity layer disposed at an opposite side of the gate electrode, a first contact plug in contact with a portion of the first impurity layer, and a second contact plug in contact with a portion of the second impurity layer. Top surfaces of the first and second impurity layers may be located at a level higher than a top surface of the gate electrode.

According to an embodiment of the inventive concept, a semiconductor device may include a peripheral circuit structure including peripheral circuits integrated on a semiconductor substrate and a cell array structure disposed on the peripheral circuit structure. The cell array structure may include memory cells, which are three-dimensionally arranged on a semiconductor layer. The peripheral circuit structure may include a device isolation layer provided in the semiconductor substrate to define an active region, a gate electrode crossing the active region, a gate insulating layer between the gate electrode and the semiconductor substrate, a first impurity layer disposed at a first side of the gate electrode, a second impurity layer disposed at a second side, opposite to the first side, of the gate electrode, a first contact plug in contact with a portion of the first impurity layer, and a second contact plug in contact with a portion of the second impurity layer. Top surfaces of the first and second impurity layers may be located at a level higher than a top surface of the gate electrode.

According to an embodiment of the inventive concept, an electronic system may include a semiconductor device including a peripheral circuit structure, a cell array structure on the peripheral circuit structure, an input/output pad, the peripheral circuit structure including peripheral circuits integrated on a semiconductor substrate, the cell array structure including memory cells, which are three-dimensionally arranged on a semiconductor layer, the input/output pad being electrically connected to at least one of the peripheral circuits, and a controller, which is electrically connected to the semiconductor device through the input/output pad and is used to control the semiconductor device. The peripheral circuit structure of the semiconductor device may include a device isolation layer provided in the semiconductor substrate to define an active region, a gate electrode crossing the active region, a gate insulating layer between the gate electrode and the semiconductor substrate, a first impurity layer disposed at a first side of the gate electrode, a second impurity layer disposed at a second side, opposite to the first side, of the gate electrode, a first contact plug in contact with a portion of the first impurity layer, and a second contact plug in contact with a portion of the second impurity layer. Top surfaces of the first and second impurity layers may be located at a level higher than a top surface of the gate electrode.

BRIEF DESCRIPTION OF THE DRAWINGS

FIGS. 17A to 17G are sectional views illustrating a method of fabricating a semiconductor device, according to an embodiment of the inventive concept.

DETAILED DESCRIPTION

Example embodiments of the inventive concepts will now be described more fully with reference to the accompanying drawings, in which example embodiments are shown.

Figure 1:
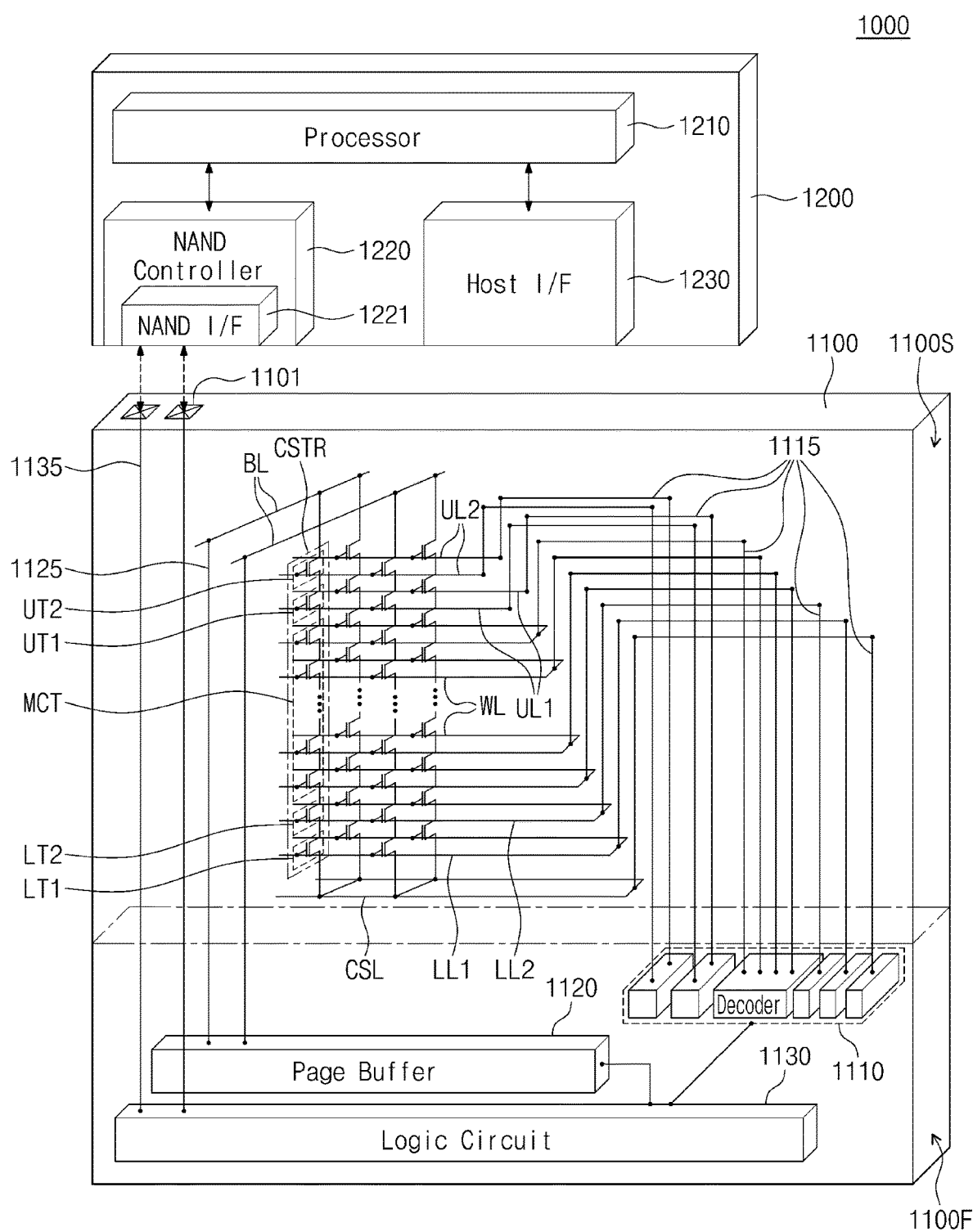
FIG. 1 is a diagram illustrating an electronic system including a semiconductor device according to an embodiment of the inventive concept.

FIG. 1 is a diagram illustrating an electronic system including a semiconductor device according to an embodiment of the inventive concept.

Referring to FIG. 1, an electronic system 1000 according to an embodiment of the inventive concept may include a semiconductor device 1100 and a controller 1200, which are electrically connected to each other. The electronic system 1000 may be a storage device including one or more semiconductor devices 1100 or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In an embodiment, the first structure 1100F may be disposed beside the second structure 1100S.

The first structure 1100F may be a peripheral circuit structure, which includes a decoder circuit 1110, a page buffer 1120, and a logic circuit 1130. The second structure 1100S may include a memory cell structure, which includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to embodiments.

In an embodiment, the upper transistors UT1 and UT2 may include at least one string selection transistor, and the lower transistors LT1 and LT2 may include at least one ground selection transistor. The gate lower lines LL1 and LL2 may be respectively used as gate electrodes of the lower transistors LT1 and LT2. The word lines WL may be respectively used as gate electrodes of the memory cell transistors MCT, and the gate upper lines UL1 and UL2 may be respectively used as gate electrodes of the upper transistors UT1 and UT2.

In an embodiment, the lower transistors LT1 and LT2 may include a lower erase control transistor LT1 and a ground selection transistor LT2, which are connected in series with each other. The upper transistors UT1 and UT2 may include a string selection transistor UT1 and an upper erase control transistor UT2, which are connected in series with each other. At least one of the lower and upper erase control transistors LT1 and UT1 may be used to perform an erase operation, in which a gate-induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F into the second structure 1100S. The bit lines BL may be electrically connected to the page buffer 1120 through second connection lines 1125, which are extended from the first structure 1100F into the second structure 1100S.

In the first structure 1100F, the decoder circuit 1110 and the page buffer 1120 may perform a control operation on at least one of the memory cell transistors MCT by a selection memory cell transistor. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is provided in the first structure 1100F and is extended into the second structure 1100S.

Although not shown, the first structure 1100F may include a voltage generator (not shown). The voltage generator may generate a program voltage, a read voltage, a pass voltage, a verification voltage, and so forth, which are needed to operate the memory cell strings CSTR. Here, the program voltage may be a relatively high voltage (e.g., 20V to 40V), compared with the read voltage, the pass voltage, and the verification voltage.

In an embodiment, the first structure 1100F may include high-voltage transistors and low-voltage transistors. Transistors that may handle voltages above 20 V are referred to high-voltage transistors, and transistors handing voltages less than 20V are referred to as low-voltage transistors. The decoder circuit 1110 may include pass transistors which are connected to the word lines WL of the memory cell strings CSTR. The pass transistors may include high-voltage transistors which may stand or handle a high voltage (e.g., the program voltage of 20V or more) applied to the word lines WL during a programming operation). The page buffer 1120 may include high-voltage transistors which may stand or handle the high voltage.

The controller 1200 may include a processor 1210, a NAND controller 1220, and a host interface 1230. In an embodiment, the electronic system 1000 may include a plurality of semiconductor devices 1100, and in this case, the controller 1200 may control the semiconductor devices 1100.

The processor 1210 may control overall operations the electronic system 1000 including the controller 1200. The processor 1210 may be operated based on a specific firmware and may control the NAND controller 1220 to access the semiconductor device 1100. The NAND controller 1220 may include a NAND interface 1221, which is used to communicate with the semiconductor device 1100. The NAND interface 1221 may be used to transmit and receive control commands to control the semiconductor device 1100, data to be written in or read from the memory cell transistors MCT of the semiconductor device 1100, and so forth. The host interface 1230 may allow communication between the electronic system 1000 and an external host. When a control command is received from an external host through the host interface 1230, the processor 1210 may control the semiconductor device 1100 in response to the control command.

Figure 2:
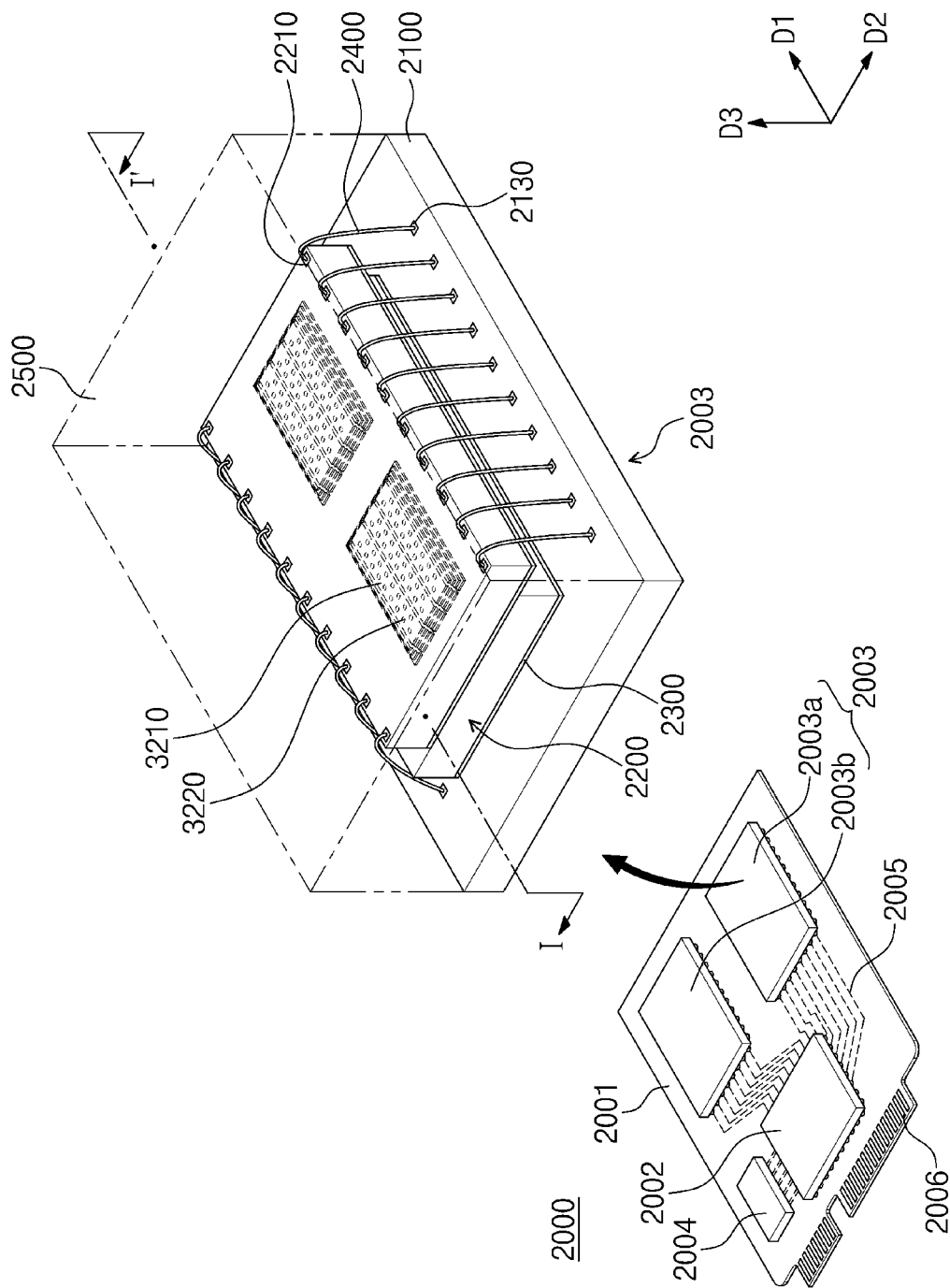
FIG. 2 is a perspective view illustrating an electronic system including a semiconductor device according to an embodiment of the inventive concept.

FIG. 2 is a perspective view illustrating an electronic system including a semiconductor device according to an embodiment of the inventive concept.

Referring to FIG. 2, an electronic system 2000 according to an embodiment of the inventive concept may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 and to each other by interconnection patterns 2005, which are formed in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In an embodiment, the electronic system 2000 may communicate with the external host, in accordance with one of interfaces, such as universal serial bus (USB), peripheral component interconnect express (PCI-Express), serial advanced technology attachment (SATA), universal flash storage (UFS) M-Phy, or the like. In an embodiment, the electronic system 2000 may be driven by a power, which is supplied from the external host through the connector 2006. The electronic system 2000 may further include a Power Management Integrated Circuit (PMIC) distributing power, which is supplied from the external host, to the controller 2002 and the semiconductor package 2003.

The controller 2002 may control a writing or reading operation on the semiconductor package 2003 such that an operation speed of the electronic system 2000 may be improved.

The DRAM 2004 may be a buffer memory, which relieves technical difficulties caused by a difference in speed between the semiconductor package 2003, which serves as a data storage device, and an external host. In an embodiment, the DRAM 2004 in the electronic system 2000 may serve as a cache memory and may provide a storage space to temporarily store data during a control operation on the semiconductor package 2003. In the case where the electronic system 2000 includes the DRAM 2004, the controller 2002 may further include a DRAM controller to control the DRAM 2004, in addition to a NAND controller to controlling the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on respective bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stacks 3210 and vertical structures 3220. Each of the semiconductor chips 2200 may include a semiconductor device, which will be described below, according to an embodiment of the inventive concept.

In an embodiment, the connection structure 2400 may be a bonding wire electrically connecting the input/output pad 2210 to the package upper pads 2130. Thus, in each of the first and second semiconductor packages 2003a and 2003b, the semiconductor chips 2200 may be electrically connected to each other in a bonding wire manner and may be electrically connected to the package upper pads 2130 of the package substrate 2100. In other embodiments, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In an embodiment, the controller 2002 and the semiconductor chips 2200 may be included in a single package. In an embodiment, the controller 2002 and the semiconductor chips 2200 may be mounted on a separate interposer substrate, which is prepared regardless of the main substrate 2001, and may be connected to each other through interconnection lines, which are provided in the interposer substrate.

Figure 3:
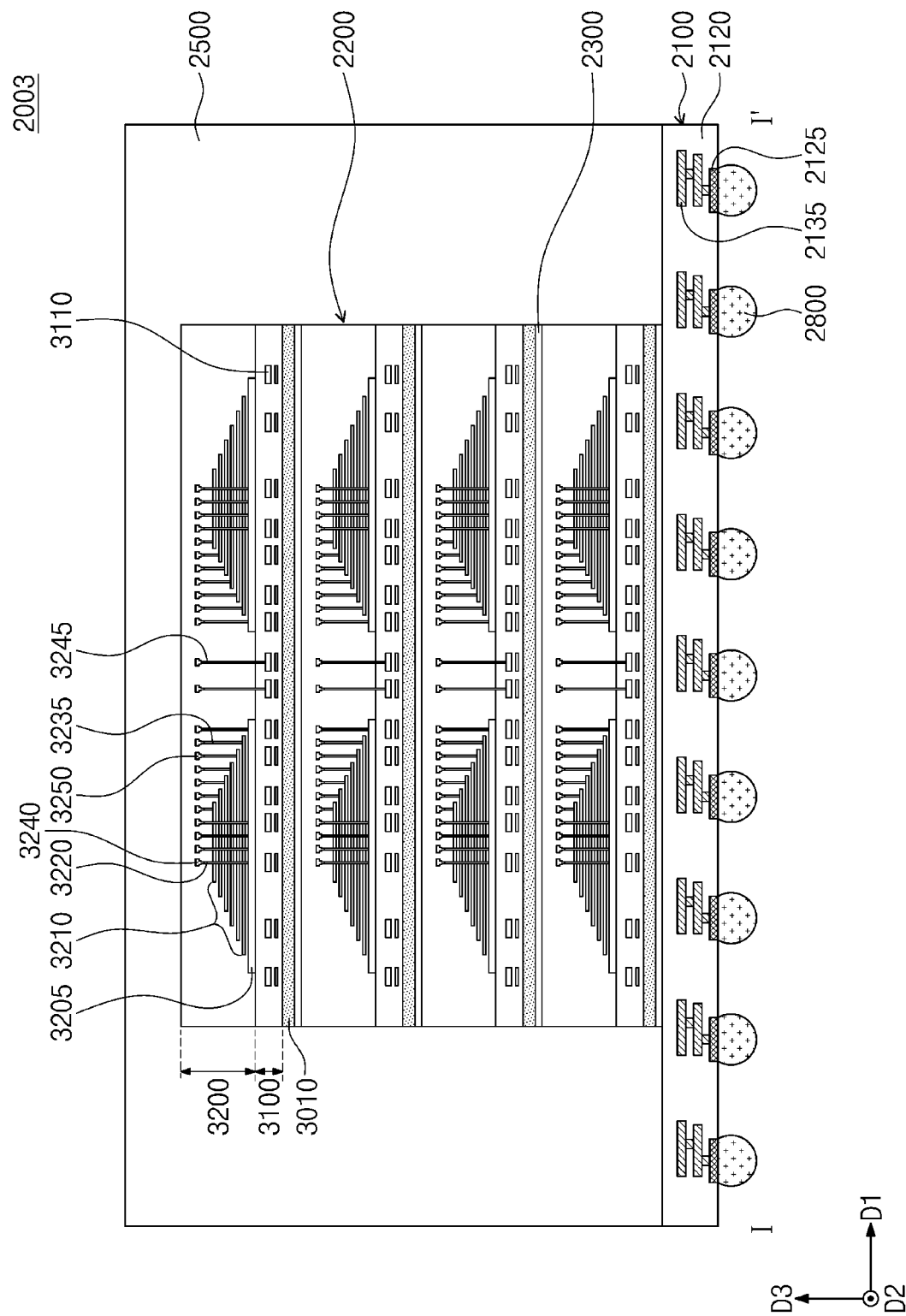
FIGS. 3 and 4 are sectional views illustrating semiconductor packages according to an embodiment of the inventive concept.
Figure 4:
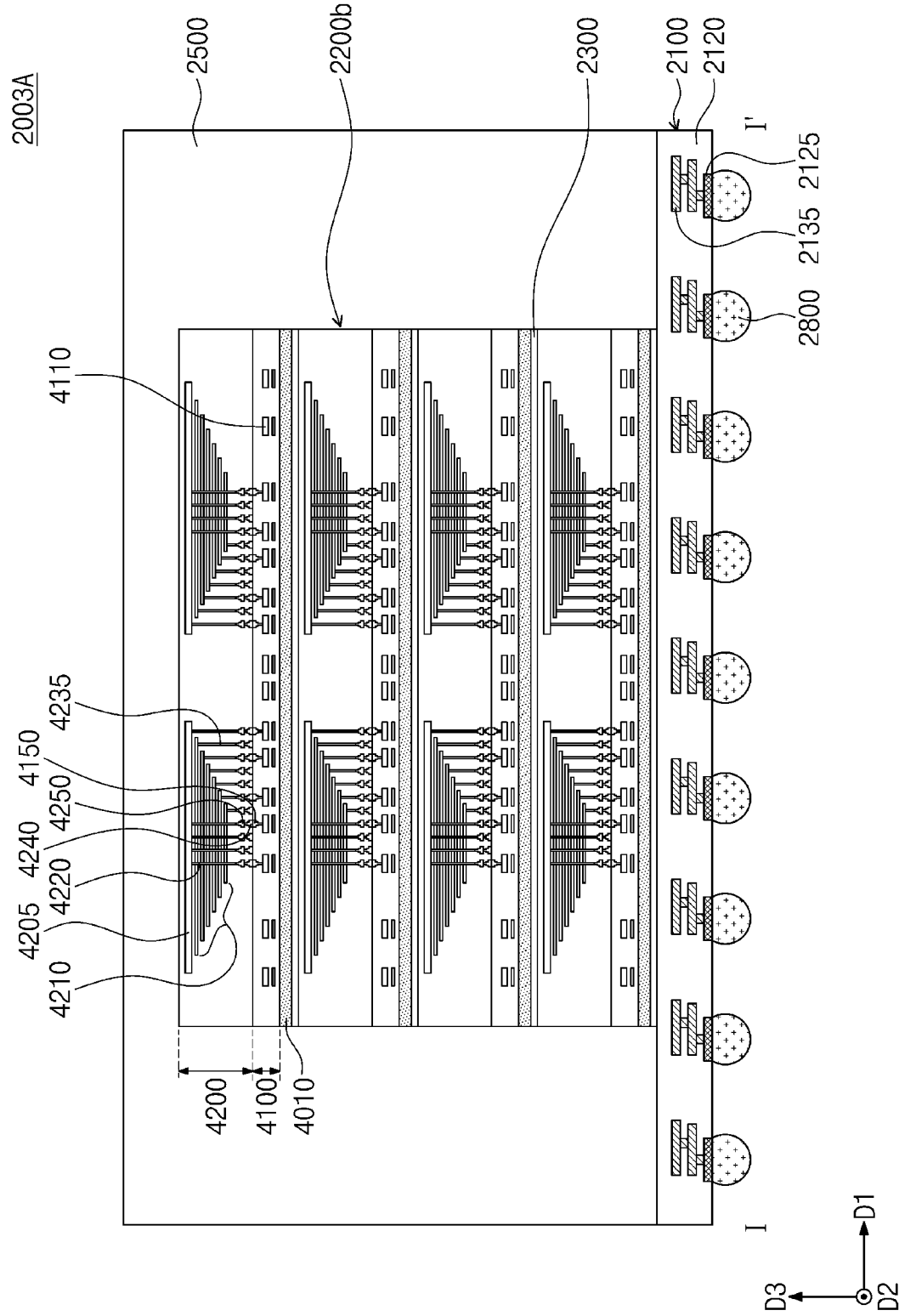

FIGS. 3 and 4 are sectional views illustrating semiconductor packages according to an embodiment of the inventive concept. For example, FIGS. 3 and 4 are sectional views, which are taken along a line I-I' of FIG. 2, and illustrate two different examples of the semiconductor package of FIG. 2.

Referring to FIG. 3, in the semiconductor package 2003, the package substrate 2100 may be a printed circuit board. The package substrate 2100 may include a package substrate body portion 2120, the package upper pads 2130 (e.g., of FIG. 2), which are disposed on a top surface of the package substrate body portion 2120, lower pads 2125, which are disposed on or exposed through a bottom surface of the package substrate body portion 2120, and internal lines 2135, which are provided in the package substrate body portion 2120 to electrically connect the package upper pads 2130 to the lower pads 2125. The package upper pads 2130 may be electrically connected to the connection structures 2400. The lower pads 2125 may be connected to the interconnection patterns 2005, which are provided in the main substrate 2001 of the electronic system 2000, through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, the stack 3210 on the source structure 3205, the vertical structures 3220 and separation structures 3230 penetrating the stack 3210, bit lines 3240 electrically connected to the vertical structures 3220, and cell contact plugs 3235 electrically connected to the word lines WL (e.g., of FIG. 1) of the stack 3210. Each of the first and second structures 3100 and 3200 and the semiconductor chips 2200 may further include separation structures to be described below.

Each of the semiconductor chips 2200 may include penetration lines 3245, which are electrically connected to the peripheral lines 3110 of the first structure 3100 and are extended into the second structure 3200. The penetration line 3245 may be disposed outside the stack 3210, and in an embodiment, the penetration line 3245 may be provided to further penetrate the stack 3210. Each of the semiconductor chips 2200 may further include the input/output pad 2210 (e.g., see FIG. 2), which are electrically connected to the peripheral lines 3110 of the first structure 3100.

Referring to FIG. 4, in a semiconductor package 2003A, each of semiconductor chips 2200a may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the source structure 4205 and the first structure 4100, vertical structures 4220 and a separation structure 4230 penetrating the stack 4210, and second junction structures 4250, which are respectively and electrically connected to the vertical structures 4220 and the word lines WL (e.g., of FIG. 1) of the stack 4210. For example, the second junction structures 4250 may be electrically and respectively connected to the vertical structures 4220 and the word lines WL (e.g., of FIG. 1) through bit lines 4240, which are electrically connected to the vertical structures 4220, and cell contact plugs 4235, which are electrically connected to the word lines WL (e.g., of FIG. 1). The first junction structures 4150 of the first structure 4100 may be in contact with and coupled to the second junction structures 4250 of the second structure 4200. The coupled portions of the first junction structures 4150 and the second junction structures 4250 may be formed of or include, for example, copper (Cu). It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Each of the first and second structures 4100 and 4200 and the semiconductor chips 2200a may further include a source structure, as will be described below with reference to an embodiment. Each of the semiconductor chips 2200a may further include the input/output pads 2210 (e.g., of FIG. 2), which are electrically connected to the peripheral lines 4110 of the first structure 4100.

The semiconductor chips 2200 or 2200a of FIG. 3 or 4 may be electrically connected to each other by the connection structures 2400, which are provided in the form of bonding wires. However, in an embodiment, semiconductor chips, which are provided in the same semiconductor package as the semiconductor chips 2200 or 2200a of FIG. 3 or 4, may be electrically connected to each other by a connection structure including through silicon vias (TSVs).

The first structure 3100 or 4100 of FIG. 3 or 4 may correspond to a peripheral circuit structure in an embodiment to be described below, and the second and second structure 3200 or 4200 of FIG. 3 or 4 may correspond to a cell array structure in an embodiment to be described below.

Figure 5:
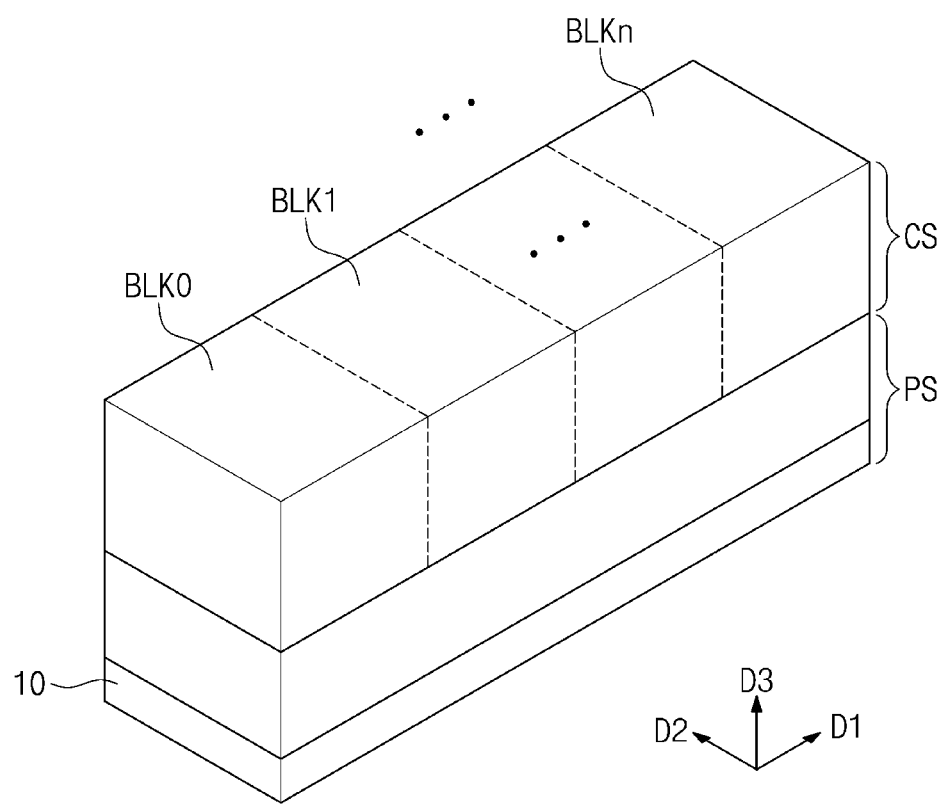
FIGS. 5 and 6 are perspective views illustrating a semiconductor device according to an embodiment of the inventive concept.
Figure 6:
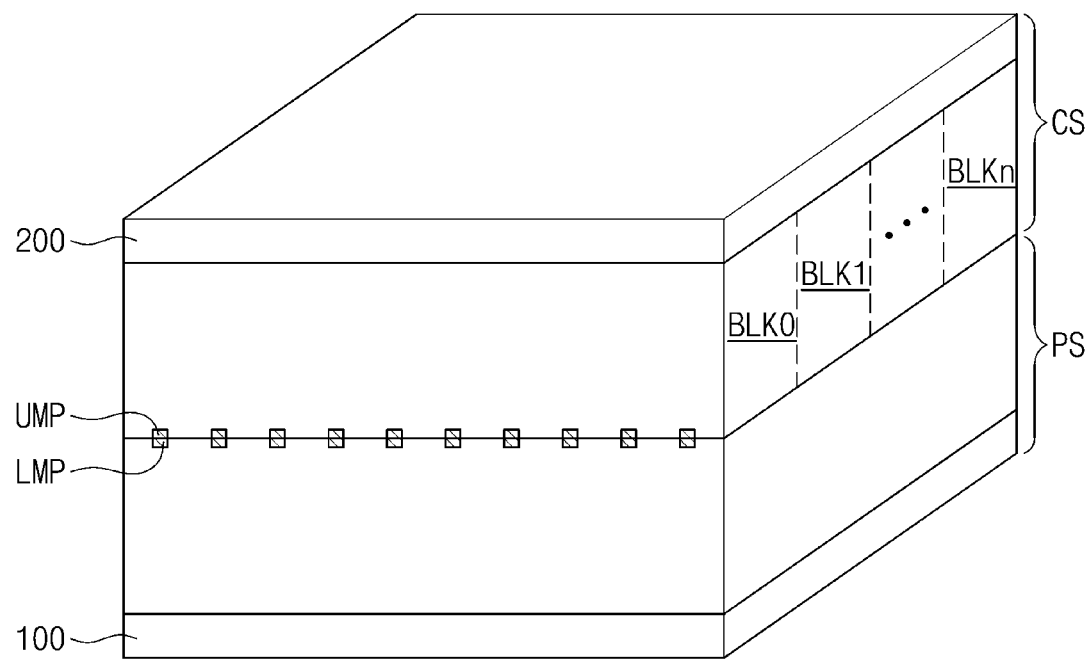

FIGS. 5 and 6 are perspective views briefly illustrating a semiconductor device according to an embodiment of the inventive concept.

Referring to FIG. 5, a semiconductor device may include a peripheral circuit structure PS on a semiconductor substrate 10 and a cell array structure CS on the peripheral circuit structure PS.

The peripheral circuit structure PS may include peripheral circuits formed on the semiconductor substrate 10. The peripheral circuits may include the row and column decoders, the page buffer, the voltage generator, the control circuit, and so forth, which are integrated on the semiconductor substrate 10, described with reference to FIG. 1.

When viewed in a plan view, the cell array structure CS may be overlapped with the peripheral circuit structure PS.

The cell array structure CS may include a plurality of memory blocks BLK0-BLKn, each of which independently performs an erase operation. Each of the memory blocks BLK0-BLKn may include a memory cell array having a three-dimensional structure or a vertically-stacked structure. Each of the memory blocks BLK0-BLKn may include the cell strings CSTR described with reference to FIG. 1.

Referring to FIG. 6, the peripheral circuit structure PS may include peripheral circuits formed on a first semiconductor substrate 100. In some embodiments, the first semiconductor substrate 100 may correspond to the semiconductor substrate 10 of FIG. 5. The peripheral circuits may include the row and column decoders, the page buffer, the voltage generator, the control circuit, and so forth, as described with reference to FIG. 1, which are integrated on the first semiconductor substrate 100.

Lower metal pads LMP may be provided at the topmost level of the peripheral circuit structure PS. The lower metal pads LMP may be electrically connected to the peripheral circuits.

The cell array structure CS may include a memory cell array including memory cells, which are three-dimensionally arranged on a second semiconductor substrate 200. The memory cell array may include the memory blocks BLK0-BLKn, as described above. Each of the memory blocks BLK0-BLKn may include the cell strings CSTR described with reference to FIG. 1.

Upper metal pads UMP may be provided at the topmost level of the cell array structure CS. In stacking of the cell array structure CS on the peripheral circuit structure PS, the cell array structure CS may by turned upside down so that the topmost level of the cell array structure is adjacent to that of the peripheral circuit structure PS. The upper metal pads UMP may be electrically connected to the memory cell array.

The lower and upper metal pads LMP and UMP may have substantially the same size and arrangement. The lower and upper metal pads LMP and UMP may be formed of or include at least one of, for example, copper (Cu), aluminum (Al), nickel (Ni), cobalt (Co), tungsten (W), titanium (Ti), tin (Sn), and alloys thereof. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

According to an embodiment of the inventive concept, the semiconductor device may be formed by forming the peripheral circuit structure PS including the peripheral circuits on the first semiconductor substrate 100, forming the cell array structure CS including the memory cells on the second semiconductor substrate 200, which is different from the first semiconductor substrate 100, and connecting the first semiconductor substrate 100 to the second semiconductor substrate 200 in a bonding manner. For example, the upper metal pads UMP of the cell array structure CS may be electrically and physically connected to the lower metal pads LMP of the peripheral circuit structure PS in a bonding manner. The lower metal pads LMP may be in contact with the upper metal pads UMP.

Figure 7:
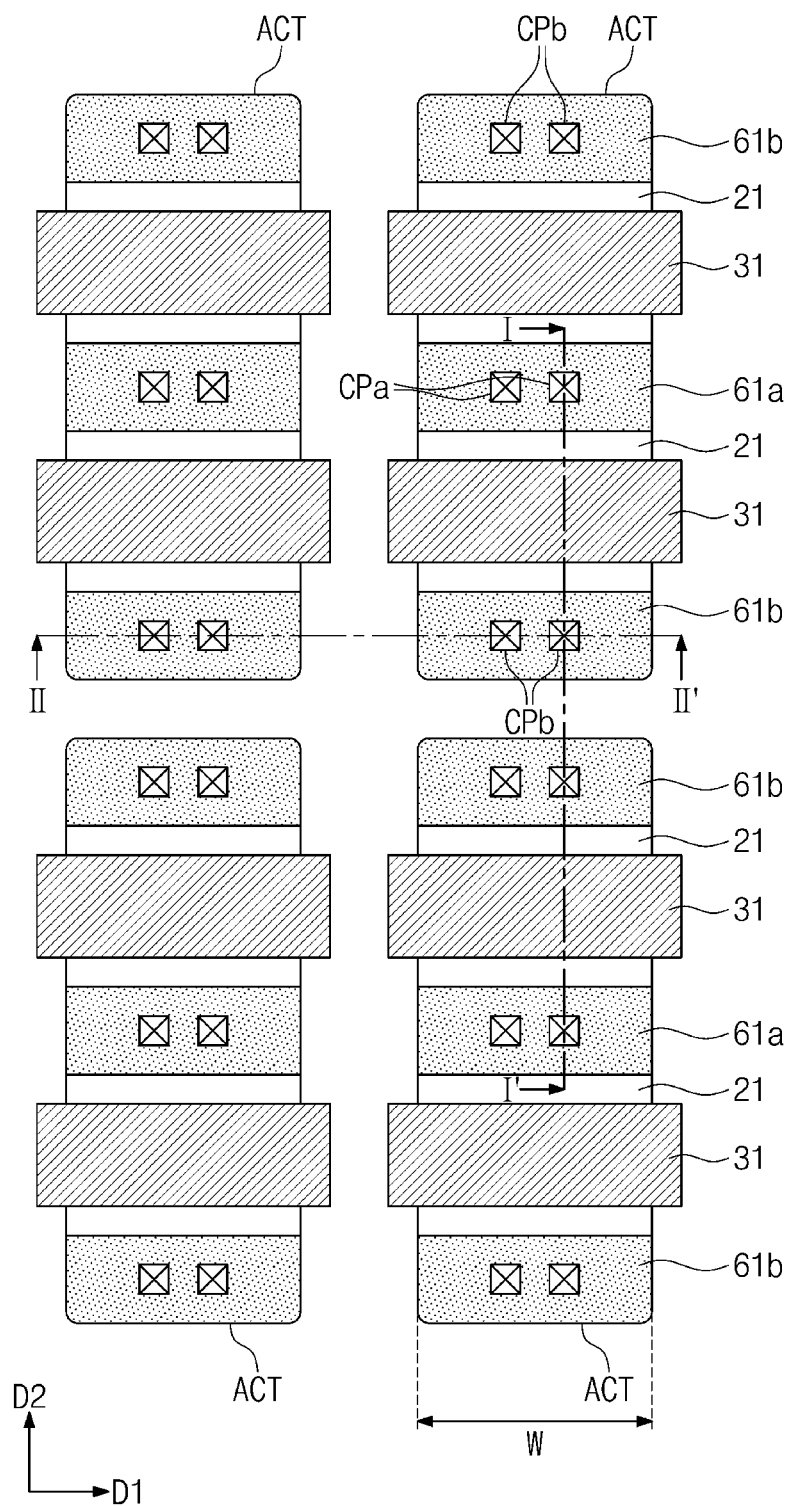
FIG. 7 is a plan view illustrating a portion of a semiconductor device according to an embodiment of the inventive concept.
Figure 8A:
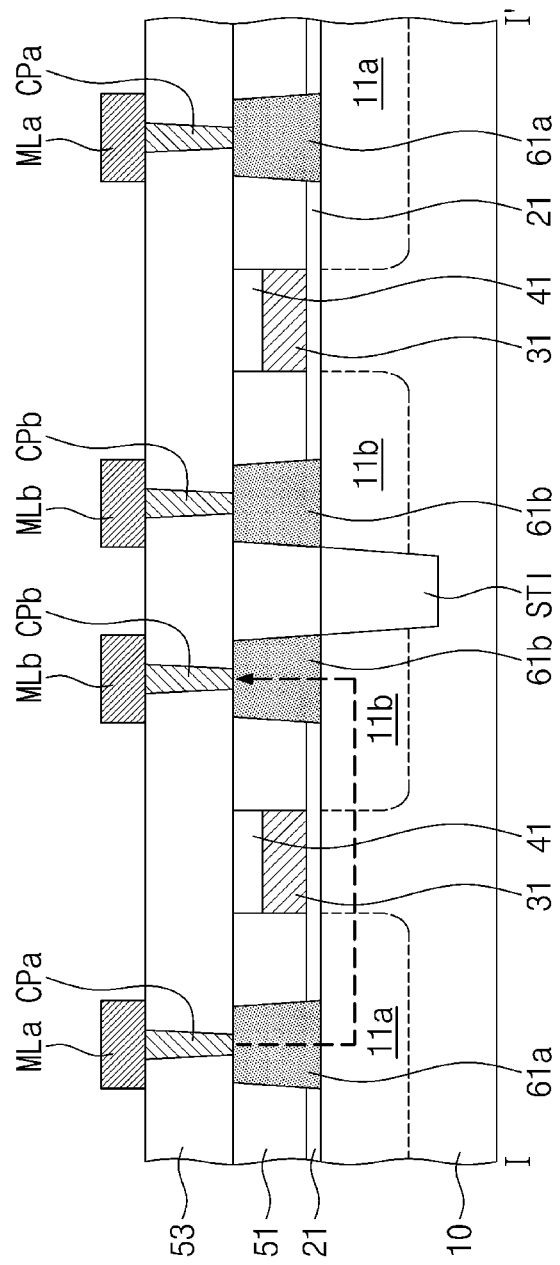
FIGS. 8A and 8B are sectional views taken along lines I-I' and II-II' of FIG. 7, respectively.
Figure 8B:
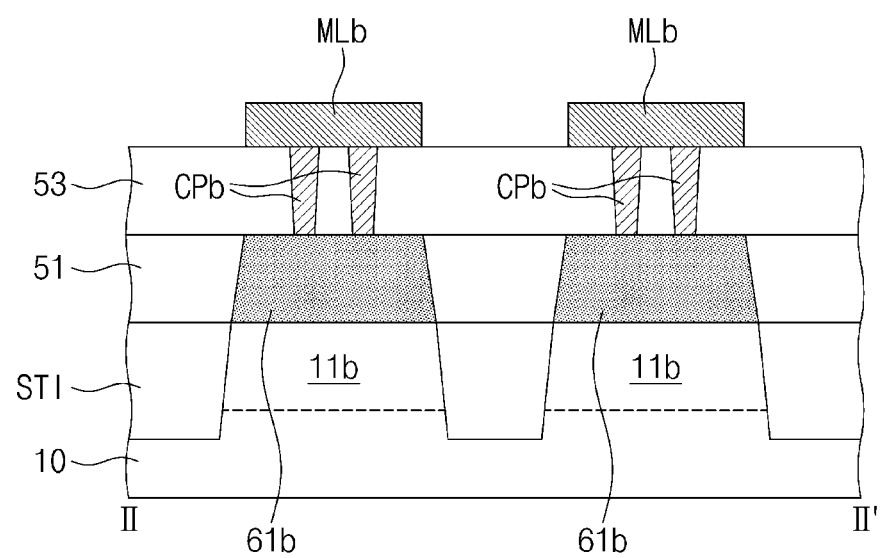

FIG. 7 is a plan view illustrating a portion of a semiconductor device according to an embodiment of the inventive concept. FIGS. 8A and 8B are sectional views taken along lines I-I' and II-II' of FIG. 7, respectively.

Referring to FIGS. 7, 8A, and 8B, a device isolation layer STI may be provided in the semiconductor substrate 10 to define active regions ACT.

The semiconductor substrate 10 may include or may be formed of at least one of a semiconductor material (e.g., silicon), an insulating material (e.g., glass), or a semiconductor or conductive material covered with an insulating material. The semiconductor substrate 10 may be a silicon substrate, a germanium substrate, a silicon-on-insulator (SOI) substrate, or a germanium-on-insulator (GOI) substrate. For example, the semiconductor substrate 10 may be a silicon wafer of a first conductivity type.

The semiconductor substrate 10 may include an n- or p-type well impurity layer (not shown), and the device isolation layer STI may be provided in the well impurity layer. The device isolation layer STI may be formed of an insulating material.

The active regions ACT defined by the device isolation layer STI may be two-dimensionally arranged in two different directions (e.g., a first direction D1 and a second direction D2). In an embodiment, each of the active regions ACT may be a bar-shaped pattern, when viewed in a plan view. Each of the active regions ACT may have a short axis in the first direction D1 and may have a long axis in the second direction D2. Each of the active regions ACT may have a predetermined length and a predetermined width in directions of its long and short axes. The shape and arrangement of the active regions ACT may be variously changed.

A gate electrode 31 and a hard mask pattern 41 may be sequentially stacked on the active region ACT of the semiconductor substrate 10. In an embodiment, a pair of the gate electrodes 31 may be disposed on each of the active regions ACT. The gate electrode 31 may be formed of or may include at least one of, for example, doped polysilicon, metals, conductive metal nitrides, conductive metal silicides, conductive metal oxides, and combinations thereof. The gate electrode 31 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concept is not limited to these examples. The gate electrode 31 may have a single- or multi-layered structure composed of at least one of the above materials. For example, the gate electrode 31 may include or may be formed of a doped polysilicon pattern, a metal silicide pattern, and/or a metal pattern.

A gate insulating pattern 21 may be disposed between the gate electrode 31 and the semiconductor substrate 10. The gate insulating pattern 21 may have a width larger than the gate electrode 31.

The gate insulating pattern 21 may be formed of or may include at least one of silicon oxide, silicon oxynitride, high-k dielectric materials, and combinations thereof. The high-k dielectric materials may have dielectric constants higher than silicon oxide and may be formed of or may include metal oxides or metal oxynitrides. For example, the high-k dielectric material for the gate insulating pattern 21 may include $HfO_2$, HfSiO, HfSiON, HfTaO, HfTiO, HfZrO, $ZrO_2$, $Al_2O_3$, or combinations thereof, but the inventive concept is not limited to these examples. Drain regions 11b, which are spaced apart from each other, may be provided in each of the active region ACTs. A source region 11a, which is spaced apart from the drain regions 11b, may be provided in each of the active regions ACT. The source region 11a may be provided in a portion of the active region ACT between a pair of the gate electrodes 31.

In the case where the well impurity layer (not shown) in the semiconductor substrate 10 contains impurities of a first conductivity type, the source and drain regions 11a and 11b may contain impurities of a second conductivity type. Portions of the source and drain regions 11a and 11b may be overlapped with the gate insulating pattern 21. The source and drain regions 11a and 11b are illustrated to be provided in the active regions ACT, but in an embodiment, the source and drain regions 11a and 11b may be omitted.

First and second epitaxial layers 61a and 61b may be disposed on the semiconductor substrate 10 and at opposite sides (i.e., opposite sides) of the gate electrodes 31. The first epitaxial layer 61a may be disposed on a portion of the source region 11a, and the second epitaxial layers 61b may be disposed on portions of the drain regions 11b.

The first and second epitaxial layers 61a and 61b may be grown (e.g., epitaxially grown) from the semiconductor substrate 10 of the active region ACT. Bottom surfaces of the first and second epitaxial layers 61a and 61b may be in contact with a top surface of the semiconductor substrate 10.

Top surfaces of the first and second epitaxial layers 61a and 61b may be located at a level higher than a top surface of the gate electrode 31. For example, the top surfaces of the first and second epitaxial layers 61a and 61b may be located at substantially the same level as a top surface of a first interlayer insulating layer 51 covering the gate electrodes 31. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Each of the first and second epitaxial layers 61a and 61b may contain impurities of a first or second conductivity type. In the case where the well impurity layer (not shown) in the semiconductor substrate 10 contains impurities of the first conductivity type, the first and second epitaxial layers 61a and 61b may contain impurities of the second conductivity type. The first epitaxial layer 61a may have an impurity concentration higher than the source region 11a, and the second epitaxial layers 61b may have an impurity concentration higher than the drain region 11b.

The first and second epitaxial layers 61a and 61b may be formed of or may include at least one of semiconductor materials (e.g., silicon (Si) or germanium (Ge)). The first and second epitaxial layers 61a and 61b may have one of polycrystalline, amorphous, and single-crystalline structures.

When measured in the first direction D1, the first and second epitaxial layers 61a and 61b may have substantially the same width W as the active region ACT. The first and second epitaxial layers 61a and 61b may be disposed to be horizontally spaced apart from the gate electrodes 31. The gate insulating pattern 21 may be disposed between the first and second epitaxial layers 61a and 61b. The second epitaxial layers 61b may be adjacent to the device isolation layer STI, compared with the gate electrodes 31, in the second direction D2. A distance between the gate electrode 31 and the first epitaxial layer 61a may be substantially equal to a distance between the gate electrode 31 and the second epitaxial layer 61b. For example, the first and second epitaxial layers 61a and 61b may be disposed to be symmetric to each other about the gate electrode 31.

As an area occupied by the transistor or an area of each active region ACT is reduced, an aspect ratio of the first or second epitaxial layer 61a or 61b may be increased. As an example, the height in the second direction D2 of the first or second epitaxial layers 61a or 61b may be larger than a width in the first direction D1 of the first or second epitaxial layer 61a or 61b.

A second interlayer insulating layer 53 may be disposed on the first interlayer insulating layer 51. The second interlayer insulating layer 53 may cover the top surfaces of the first and second epitaxial layers 61a and 61b.

First contact plugs CPa may be provided to penetrate the second interlayer insulating layer 53 and to be in contact with portions of the first epitaxial layers 61a. A metal silicide layer (not shown) may be interposed between the first contact plugs CPa and the first epitaxial layer 61a.

Second contact plugs CPb may be provided to penetrate the second interlayer insulating layer 53 and to be in contact with portions of the second epitaxial layers 61b. A plurality of the second contact plugs CPb may be coupled to the second epitaxial layers 61b. A metal silicide layer (not shown) may be interposed between the second contact plugs CPb and the second epitaxial layers 61b.

A first conductive line MLa may be provided on the second interlayer insulating layer 53 and may be connected to the first contact plugs CPa, and a second conductive line MLb may be provided on the second interlayer insulating layer 53 and may be connected to the second contact plugs CPb.

In an embodiment, a transistor including the first and second epitaxial layers 61a and 61b may be a high-voltage transistor which has a high junction breakdown voltage of about 20V. In an embodiment, the first epitaxial layer 61a may serve as a source terminal of the high-voltage transistor, and the second epitaxial layers 61b may serve as drain terminals of the high-voltage transistor. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Since the top surfaces of the first and second epitaxial layers 61a and 61b are located at a level higher than the top surface of the semiconductor substrate 10, during an operation of the transistor, a current path between the source and drain terminals may have an increased length. Accordingly, the transistor may have an increased junction breakdown voltage. Since the top surfaces of the first and second epitaxial layers 61a and 61b are located at a level higher than the top surface of the semiconductor substrate 10, a distance between the second epitaxial layers 61b, which are provided on adjacent ones of the active regions ACT, may be increased, and thus, it may be possible to reduce a leakage current between the transistors, which are adjacent to each other.

Hereinafter, semiconductor devices according to some embodiments of the inventive concept will be described. For concise description, an element previously described with reference to FIGS. 7, 8A, and 8B may be identified by the same reference number without repeating an overlapping description thereof.

FIGS. 9 to 16 are sectional views illustrating a portion of a semiconductor device according to an embodiment of the inventive concept.

Figure 9:
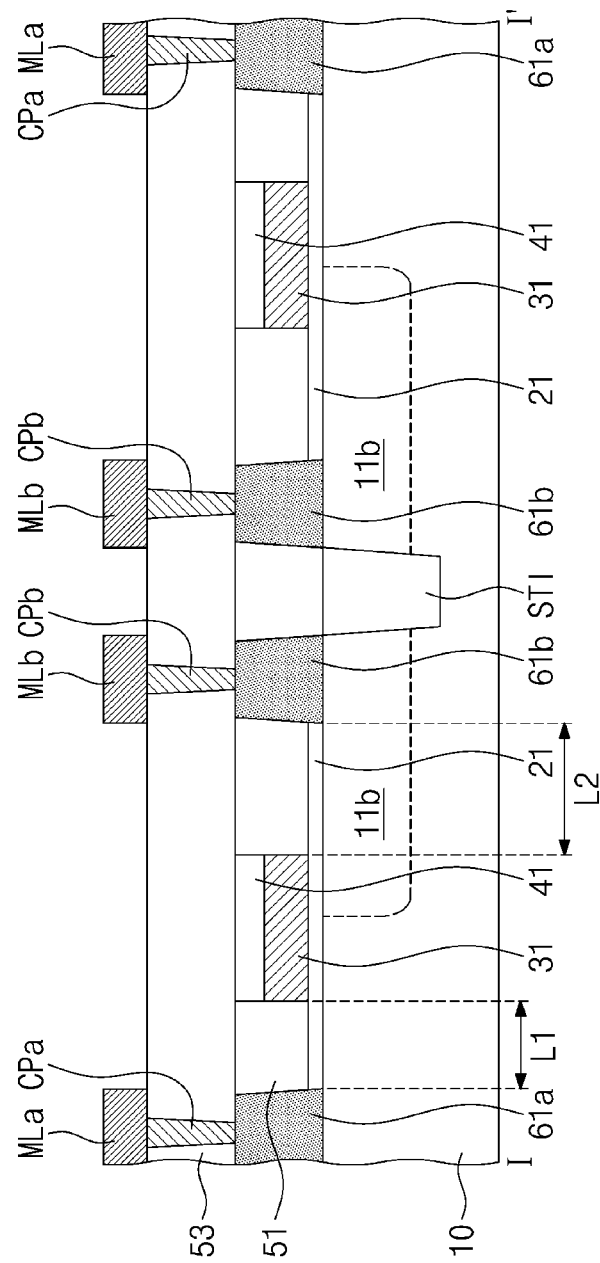
FIGS. 9 to 16 are sectional views illustrating a portion of a semiconductor device according to an embodiment of the inventive concept.

In the embodiment shown in FIG. 9, the source region 11a, which is provided in the semiconductor substrate 10, may be omitted. The drain region 11b may be overlapped with a portion of the gate electrode 31.

The first and second epitaxial layers 61a and 61b may be asymmetric in terms of a distance from the gate electrode 31. For example, a first distance L1 between the first epitaxial layer 61a and the gate electrode 31 may be different from a second distance L2 between the second epitaxial layer 61b and the gate electrode 31. In an embodiment, the second distance L2 may be larger than the first distance L1. Accordingly, it may be possible to weaken an electric field, which is produced by a high voltage applied to the second epitaxial layer 61b, and to secure a sufficient breakdown voltage margin.

Figure 10:
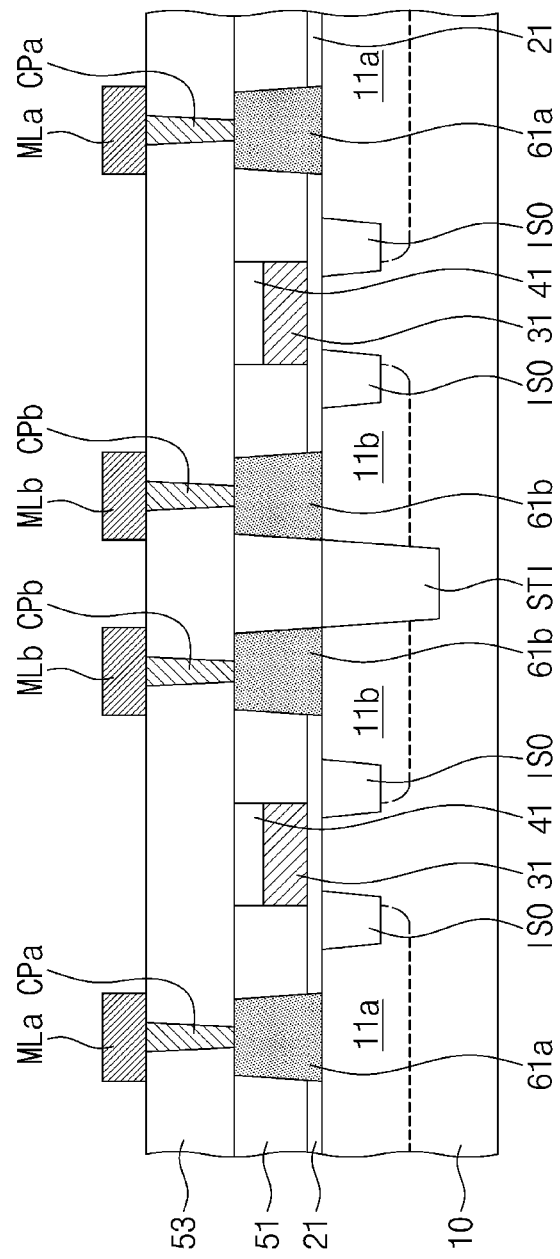

In the embodiment shown in FIG. 10, block insulating patterns ISO may be provided below the gate electrode 31. The block insulating patterns ISO may be formed of or may include the same insulating material as the device isolation layer STI.

The block insulating patterns ISO may be provided in the semiconductor substrate 10 and between the first and second epitaxial layers 61a and 61b. The block insulating patterns ISO may be spaced apart from each other. The block insulating patterns ISO may be partially overlapped with the gate electrode 31. Due to the presence of the block insulating patterns ISO, a length of a current path between the source and drain terminals of the transistor may be increased. For example, during an operation of the transistor, the current path may be formed along side and bottom surfaces of the block insulating patterns ISO, and thus, the length of the current path may be increased.

Furthermore, the block insulating patterns ISO may weaken a strong electric field, which is produced between the second epitaxial layer 61b and the gate electrode 31 when a high voltage is applied to the second epitaxial layer 61b (i.e., the drain terminal). Accordingly, it may be possible to secure a sufficient margin for a junction breakdown voltage between the gate electrode 31 and the drain terminal.

Figure 11:
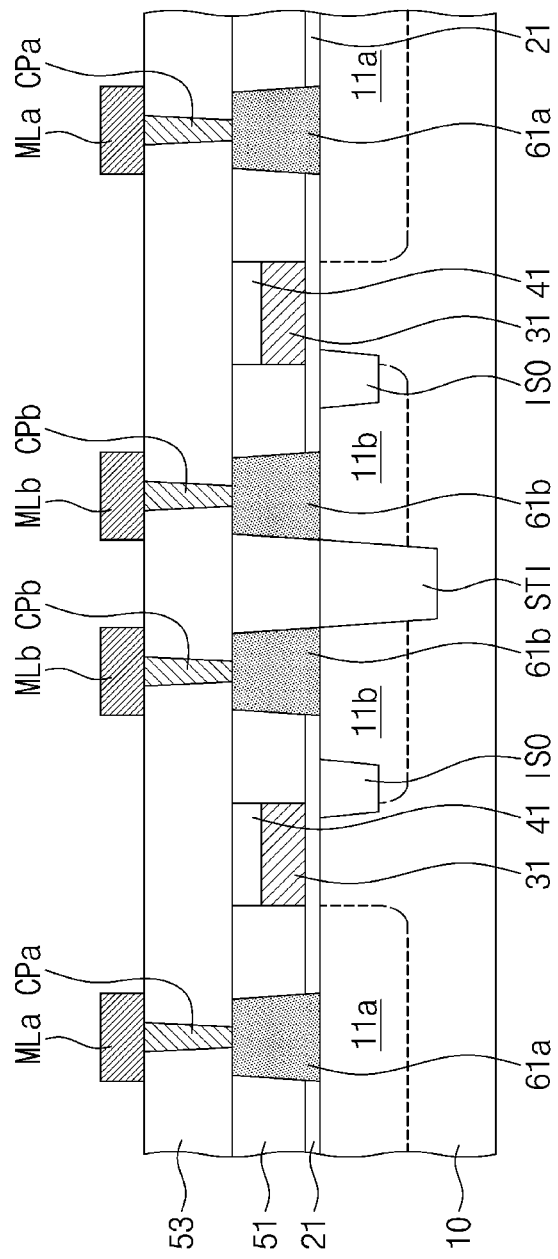

In the embodiment shown in FIG. 11, the block insulating pattern ISO may be provided in the semiconductor substrate 10 and between the gate electrode 31 and the second epitaxial layer 61b.

Figure 12:
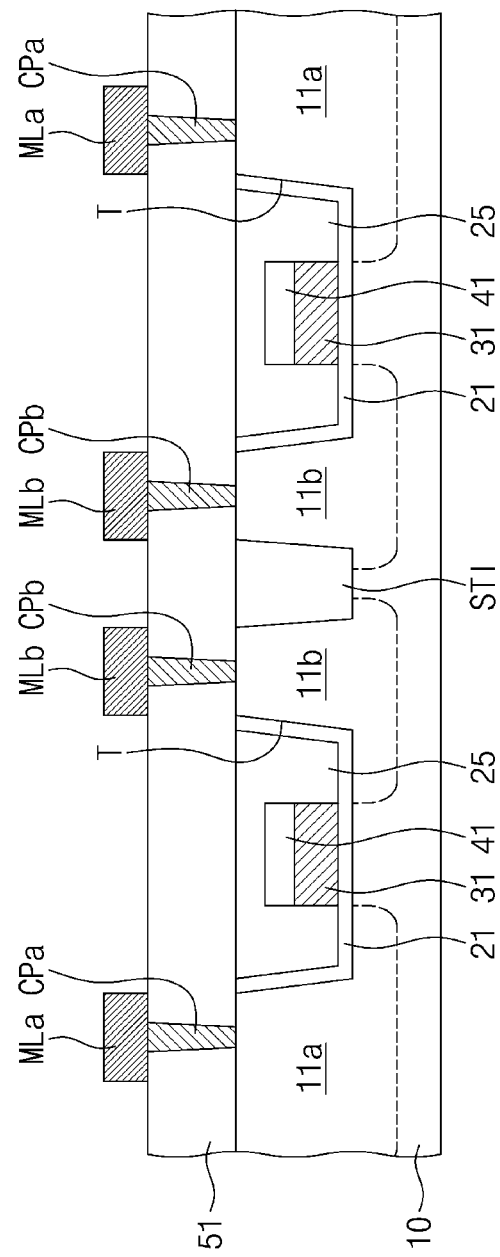

In the embodiment shown in FIG. 12, the source and drain regions 11a and 11b may be provided in the active region ACT of the semiconductor substrate 10 to be spaced apart from each other, and a trench T (i.e., a recess region) may be defined in the semiconductor substrate 10 between the source and drain regions 11a and 11b. The trench T may be formed by etching a portion of the semiconductor substrate 10 and may have a bottom surface that is located at a level lower than the top surface of the semiconductor substrate 10.

In the present embodiment, the gate electrode 31 and the hard mask pattern 41 may be provided in the trench T of the semiconductor substrate 10, and the gate insulating pattern 21 may be disposed between the gate electrode 31 and an inner surface of the trench T. The gate insulating pattern 21 may conformally cover the inner surface of the trench T.

The trench T, in which the gate electrode 31 and the hard mask pattern 41 are provided, may be filled with an insulating gapfill layer 25. The insulating gapfill layer 25 may have a top surface that is located at substantially the same level as the top surface of the semiconductor substrate 10.

The first interlayer insulating layer 51 may be provided on the semiconductor substrate 10 to cover the top surface of the insulating gapfill layer 25. The first contact plugs CPa may penetrate the first interlayer insulating layer 51 and may be coupled to the source region 11a, and the second contact plugs CPb may penetrate the first interlayer insulating layer 51 and may be coupled to the drain region 11b. A metal silicide layer (not shown) may be interposed between the first and second contact plugs CPa and CPb and the source and drain regions 11a and 11b. For example, a metal silicide may be interposed between the first contact plug CPa and the source region 11a, and a metal silicide may be interposed between the second contact plug CPb and the drain region 11b.

Since a bottom surface of the gate electrode 31 is located at a level lower than the top surfaces of the source and drain regions 11a and 11b, a current path between the source and drain terminals may have an increased length, during an operation of the transistor.

Figure 13:
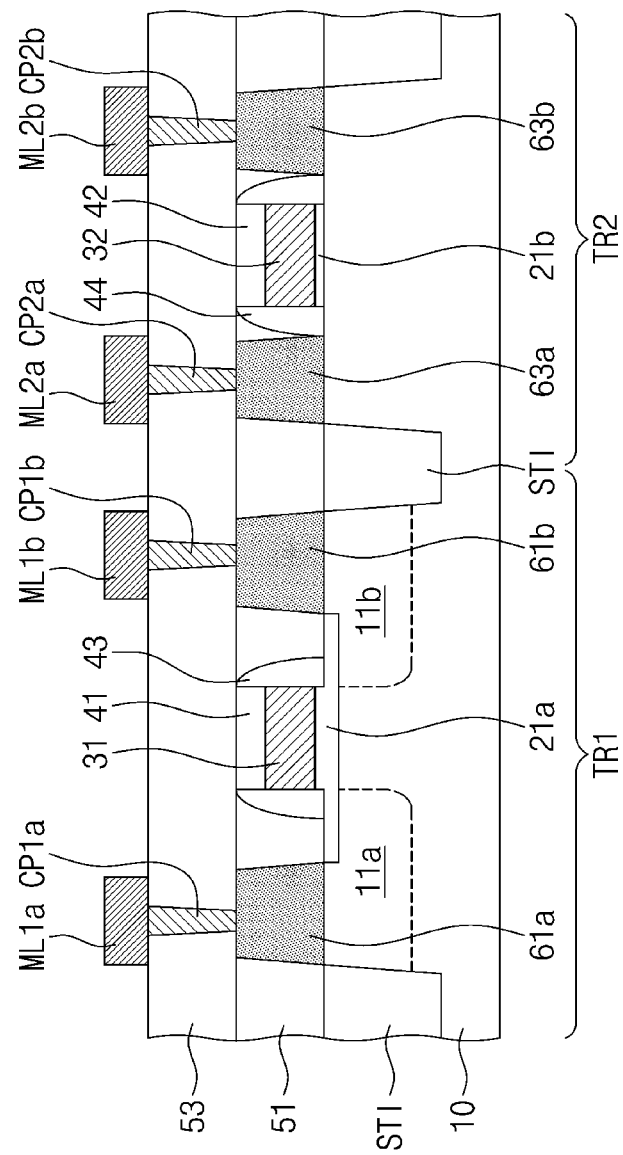

In the embodiment shown in FIG. 13, the semiconductor substrate 10 may include a first transistor region TR1 and a second transistor region TR2. In an embodiment, a high-voltage transistor may be provided on the first transistor region TR1 of the semiconductor substrate 10, and a low-voltage transistor may be provided on the second transistor region TR2 of the semiconductor substrate 10.

A first gate electrode 31 may be disposed on the first transistor region TR1 of the semiconductor substrate 10, and a second gate electrode 32 may be disposed on the second transistor region TR2 of the semiconductor substrate 10. The first and second gate electrodes 31 and 32 may be formed of or may include at least one of impurity doped polysilicon, metal silicides, metal nitrides, and metals.

First and second hard mask patterns 41 and 42 may be disposed on the first and second gate electrodes 31 and 32, respectively.

A first gate insulating pattern 21a may be disposed between the semiconductor substrate 10 and the first gate electrode 31, and a second gate insulating pattern 21b may be disposed between the semiconductor substrate 10 and the second gate electrode 32. A width of the first gate insulating pattern 21a may be larger than a width of the first gate electrode 31. The first gate insulating pattern 21a below the first gate electrode 31 may be thicker than the second gate insulating pattern 21b. Top surfaces of the first and second gate insulating patterns 21a and 21b may be located at substantially the same level. Bottom surfaces of the first and second gate electrodes 31 and 32 may be located at substantially the same level. A bottom surface of the first gate insulating pattern 21a may be located at a level that is lower than a bottom surface of the second gate insulating pattern 21b.

First gate spacers 43 may be disposed on opposite side surfaces of the first gate electrode 31, and second gate spacers 44 may be disposed on opposite side surfaces (i.e., opposite sides) of the second gate electrode 32.

In the first transistor region TR1, the first source and drain regions 11a and 11b may be provided in the semiconductor substrate 10 and at opposite sides of the first gate electrode 31. In an embodiment, the first source and drain regions 11a and 11b may be omitted.

In the first transistor region TR1, the first and second epitaxial layers 61a and 61b may be disposed on the semiconductor substrate 10 and at opposite sides of the first gate electrode 31. In the second transistor region TR2, third and fourth epitaxial layers 63a and 63b may be disposed on the semiconductor substrate 10 and at opposite sides of the second gate electrode 32.

The first and second epitaxial layers 61a and 61b may be spaced apart from each other with the first gate insulating pattern 21a interposed therebetween. The first and second epitaxial layers 61a and 61b may be disposed adjacent to the device isolation layer STI, compared with the first gate electrode 31. The third and fourth epitaxial layers 63a and 63b may be disposed between the device isolation layer STI and the second gate electrode 32. A distance between the first or second epitaxial layer 61a or 61b and the first gate electrode 31 may be larger than a distance between the third or fourth epitaxial layer 63a or 63b and the second gate electrode 32.

The first and second epitaxial layers 61a and 61b of FIG. 13 may have substantially the same features as the first and second epitaxial layers 61a and 61b described with reference to FIGS. 7, 8A, and 8B.

The third and fourth epitaxial layers 63a and 63b may contain impurities of a first or second conductivity type. The third and fourth epitaxial layers 63a and 63b may be formed of or may include at least one of semiconductor materials (e.g., silicon (Si) or germanium (Ge)). The third and fourth epitaxial layers 63a and 63b may have or may be formed of one of polycrystalline, amorphous, and single-crystalline structures.

The third and fourth epitaxial layers 63a and 63b may have top surfaces which are located at substantially the same level as the top surfaces of the first and second epitaxial layers 61a and 61b. For example, the top surfaces of the first to fourth epitaxial layers 61a, 61b, 63a, and 63b may be located at substantially the same level as the top surface of the first interlayer insulating layer 51.

The second interlayer insulating layer 53 may be disposed on the first interlayer insulating layer 51 and may cover the top surfaces of the first to fourth epitaxial layers 61a, 61b, 63a, and 63b.

In the first transistor region TR1, first contact plugs CP1a may be provided to penetrate the second interlayer insulating layer 53 and to be in contact with portions of the first epitaxial layer 61a. Second contact plugs CP1b may be provided to penetrate the second interlayer insulating layer 53 and to be in contact with portions of the second epitaxial layer 61b.

In the second transistor region TR2, third contact plugs CP2a may be provided to penetrate the second interlayer insulating layer 53 and to be in contact with portions of the third epitaxial layer 63a. Fourth contact plugs CP2b may be provided to penetrate the second interlayer insulating layer 53 and to be in contact with portions of the fourth epitaxial layer 63b.

A first conductive line ML1a may be provided on the second interlayer insulating layer 53 and may be connected to the first contact plugs CP1a, and a second conductive line ML1b may be provided on the second interlayer insulating layer 53 and may be connected to the second contact plugs CP1b. A third conductive line ML2a may be provided on the second interlayer insulating layer 53 and may be connected to the third contact plugs CP2a, and a fourth conductive line ML2b may be provided on the second interlayer insulating layer 53 and may be connected to the fourth contact plugs CP2b.

Figure 14:
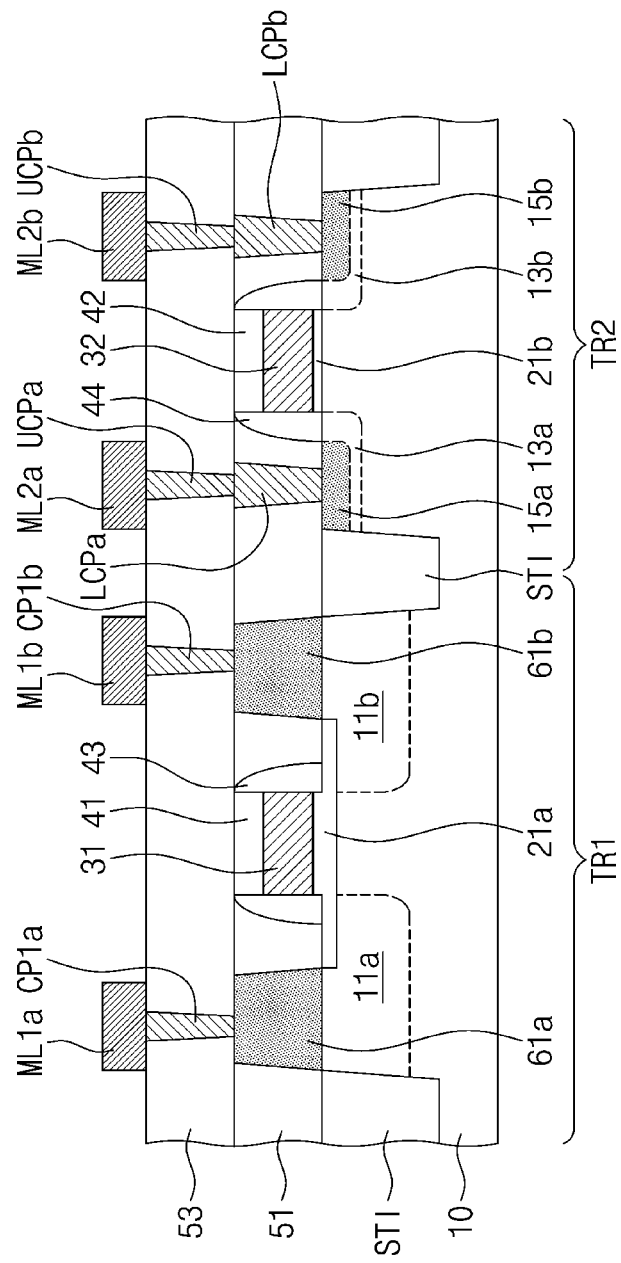

In the embodiment shown in FIG. 14, the third and fourth epitaxial layers 63a and 63b may be omitted from the second transistor region TR2, unlike the embodiment of FIG. 13.

In the second transistor region TR2, lightly-doped source and drain regions 13a and 13b may be provided in the semiconductor substrate 10 and at opposite sides of the second gate electrode 32. Heavily-doped source and drain impurity regions 15a and 15b may be provided in the lightly-doped source and drain regions 13a and 13b.

In the second transistor region TR2, a first lower contact plug LCPa may penetrate the first interlayer insulating layer 51 and may be coupled to the heavily-doped source region 15a, and a second lower contact plug LCPb may penetrate the first interlayer insulating layer 51 and may be coupled to the heavily-doped drain region 15b. A first upper contact plug UCPa may penetrate the second interlayer insulating layer 53 and may be coupled to the first lower contact plug LCPa, and a second upper contact plug UCPb may penetrate the second interlayer insulating layer 53 and may be coupled to the second lower contact plug LCPb. The third and fourth conductive lines ML2a and ML2b may be coupled to the first and second upper contact plugs UCPa and UCPb, respectively, in the second transistor region TR2.

Figure 15:
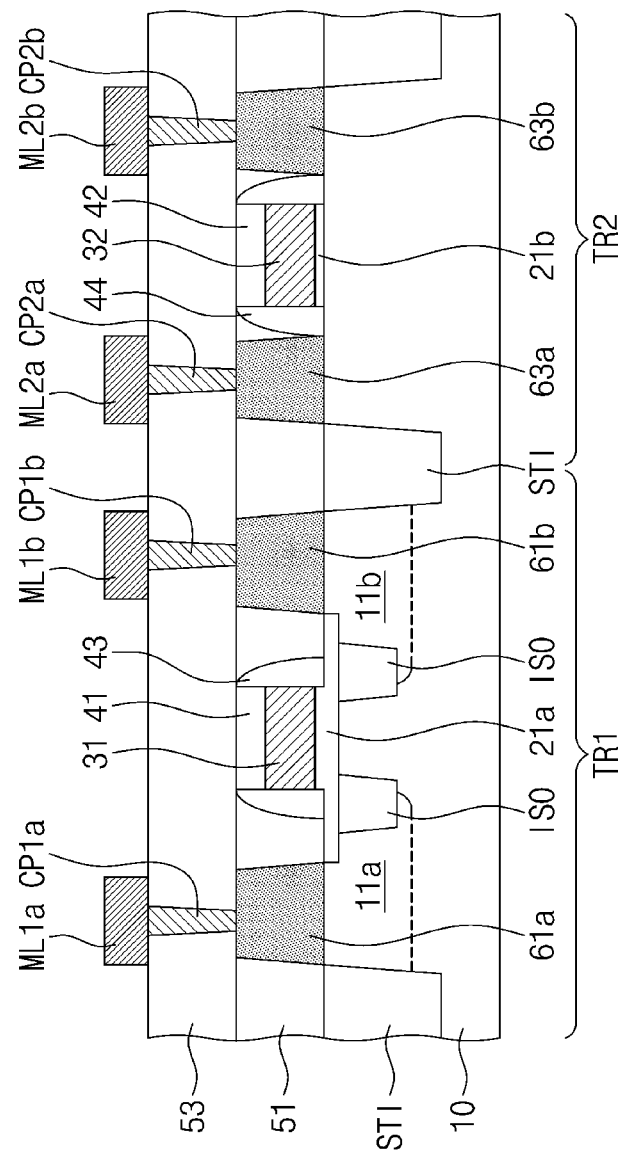

In the embodiment shown in FIG. 15, the block insulating patterns ISO may be provided in the first transistor region TR1 and below the first gate electrode 31, unlike the embodiment of FIG. 13. Portions of the block insulating patterns ISO may be overlapped with the first gate electrode 31. The block insulating patterns ISO of FIG. 15 may have substantially the same features as the block insulating patterns ISO described with reference to FIG. 10.

Figure 16:
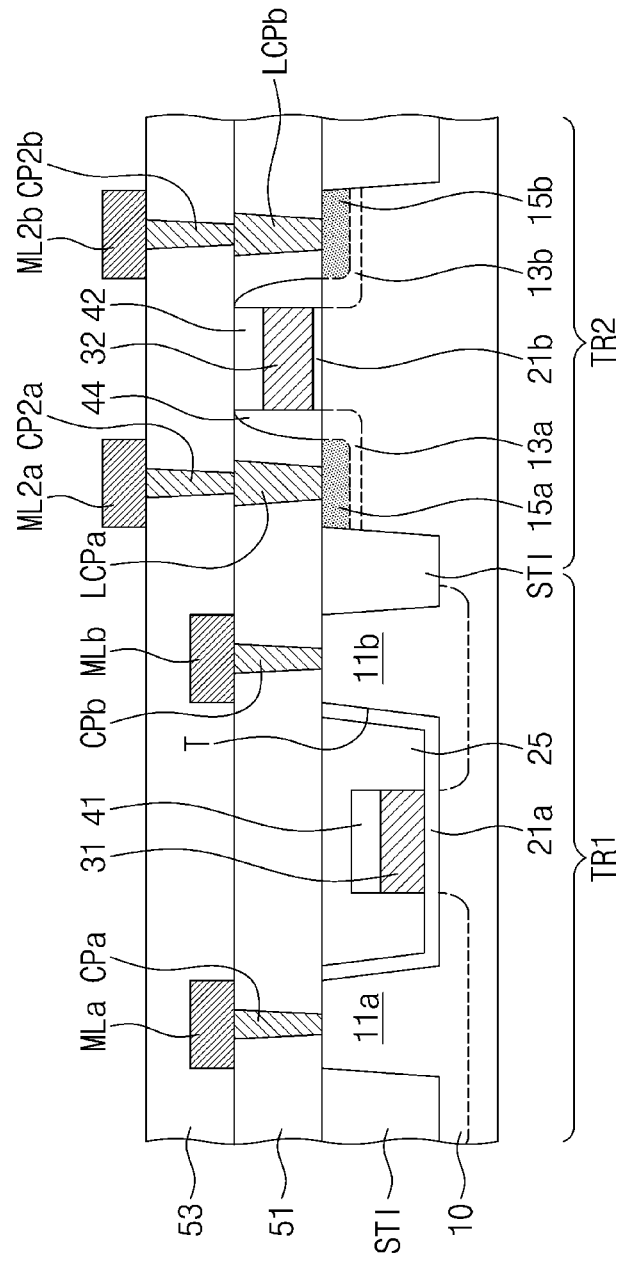

In the embodiment shown in FIG. 16, the first gate electrode 31 on the first transistor region TR1 may be disposed in a trench, which is formed in the semiconductor substrate 10 between the source region 11a and the drain region 11b, as described with reference to FIG. 12. For example, in the first transistor region TR1, a bottom surface of the first gate electrode 31 may be located at a level lower than top surfaces of the source and drain regions 11a and 11b. Furthermore, a top surface of the first gate electrode 31 may be located at a level lower than a bottom surface of the second gate electrode 32 provided on the second transistor region TR2.

In the second transistor region TR2, lightly- and heavily-doped source regions 13a and 15a may be provided in a portion of the semiconductor substrate 10, which is located at a side of the second gate electrode 32, and lightly- and heavily-doped drain regions 13b and 15b may be provided in a portion of the semiconductor substrate 10, which is located at an opposite side of the second gate electrode 32.

FIGS. 17A to 17G are sectional views illustrating a method of fabricating a semiconductor device, according to an embodiment of the inventive concept.

Referring to FIG. 17A, the semiconductor substrate 10 may include the first transistor region TR1 and the second transistor region TR2.

First and second gate insulating layers 20a and 20b may be formed on the semiconductor substrate 10. The gate insulating layer may include a first gate insulating layer 20a having a first thickness and a second gate insulating layer 20b having a second thickness smaller than the first thickness. The first and second gate insulating layers 20a and 20b may include or may be formed of a silicon oxide layer, a silicon nitride layer, or a silicon oxynitride layer and may be formed by a deposition process or an oxidation process.

Before the formation of the first and second gate insulating layers 20a and 20b, a recess region may be formed by recessing the top surface of the semiconductor substrate 10 in the first transistor region TR1, and the first gate insulating layer 20a may be formed in the recess region of the semiconductor substrate 10.

A gate conductive layer 30 may be deposited on the first and second gate insulating layers 20a and 20b to a uniform thickness. The gate conductive layer 30 may be a polysilicon layer doped with impurities. A mask layer 40 made of an insulating material may be formed on the gate conductive layer 30.

Referring to FIG. 17B, the device isolation layer STI may be formed in the semiconductor substrate 10 to define the active regions ACT.

The formation of the device isolation layer STI may include patterning the mask layer 40, the gate conductive layer 30, the first and second gate insulating layers 20a and 20b, and the semiconductor substrate 10 to form trenches, filling the trenches with an insulating material, and performing a planarization process on the insulating material to expose the top surface of the gate conductive layer 30. The mask layer 40 may be removed before or during the planarization process.

Referring to FIG. 17C, the first and second hard mask patterns 41 and 42 may be formed on the gate conductive layer 30 and on the first and second transistor regions TR1 and TR2, respectively.

The first and second gate electrodes 31 and 32 may be formed on the first and second transistor regions TR1 and TR2, respectively by anisotropically etching the gate conductive layer 30 using the first and second hard mask patterns 41 and 42 as an etch mask.

In an embodiment, during the formation of the first and second gate electrodes 31 and 32, the first gate insulating pattern 21a may be formed by etching portions of the first gate insulating layer 20a at opposite sides of the first gate electrode 31, and the second gate insulating pattern 21b may be formed by etching portions of the second gate insulating layer 20b, which are not covered with the second gate electrode 32. The portions of the first gate insulating layer 20a at opposite sides of the first gate electrode 31 may be thinned during the formation of the first and second gate electrodes 31 and 32. Alternatively, during the formation of the first and second gate electrodes 31 and 32, the semiconductor substrate 10 may be exposed at opposite sides of the first gate electrode 31.

Referring to FIG. 17D, the first gate spacers 43 may be formed on opposite side surfaces of the first gate electrode 31, and the second gate spacers 44 may be formed on opposite side surfaces of the second gate electrode 32. The first gate spacers 43 may be located on the first gate insulating pattern 21a.

Thereafter, the source and drain regions 11a and 11b may be formed by doping portions of the semiconductor substrate 10, which are located at opposite sides of the first gate electrode 31, with impurities of a first or second conductivity type. In an embodiment, the source and drain regions 11a and 11b may also be formed in portions of the semiconductor substrate 10 at opposite sides of the second gate electrode 32.

Referring to FIG. 17E, the first interlayer insulating layer 51 may be formed to cover the top surface of the semiconductor substrate 10. Next, the first interlayer insulating layer 51 may be patterned to form first openings OP1, which expose portions of the first transistor region TR1 of the semiconductor substrate 10, and second openings OP2, which expose portions of the second transistor region TR2 of the semiconductor substrate 10.

Here, the first openings OP1 may be formed to expose portions of the source and drain regions 11a and 11b on the first transistor region TR1. Furthermore, the first openings OP1 may be formed to have a width that is larger than the width of the active region ACT in the first direction D1. The active region ACT is described with reference to FIG. 7.

Referring to FIG. 17F, a selective epitaxial growth (SEG) process may be performed using the portions of the semiconductor substrate 10, which are exposed through the first and second openings OP1 and OP2, as a seed layer. Accordingly, the first and second epitaxial layers 61a and 61b may be formed in the first openings OP1, respectively, and the third and fourth epitaxial layers 63a and 63b may be formed in the second openings OP2, respectively. The first to fourth epitaxial layers 61a, 61b, 63a, and 63b may be doped in situ with impurities of the first or second conductivity type. Alternatively, after the formation of the first to fourth epitaxial layers 61a, 61b, 63a, and 63b, impurities of the first or second conductivity type may be injected into the first to fourth epitaxial layers 61a, 61b, 63a, and 63b.

Figure 17G:
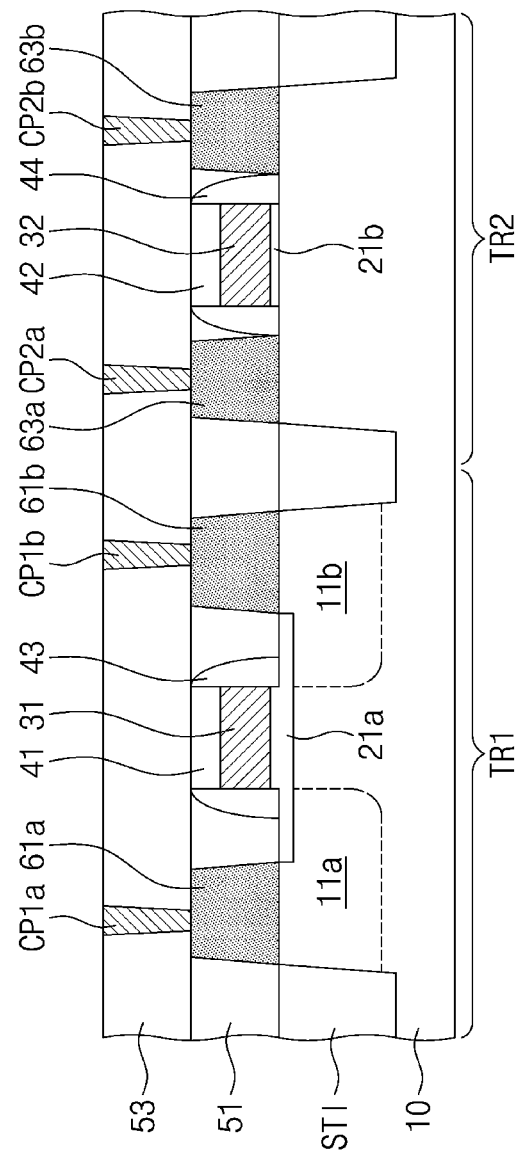

Referring to FIG. 17G, the second interlayer insulating layer 53 may be formed on the first interlayer insulating layer 51, and then, the first and second contact plugs CP1a and CP1b may be formed to be coupled to the first and second epitaxial layers 61a and 61b, respectively, and the third and fourth contact plugs CP2a and CP2b may be formed to be coupled to the third and fourth epitaxial layers 63a and 63b, respectively.

Figure 18:
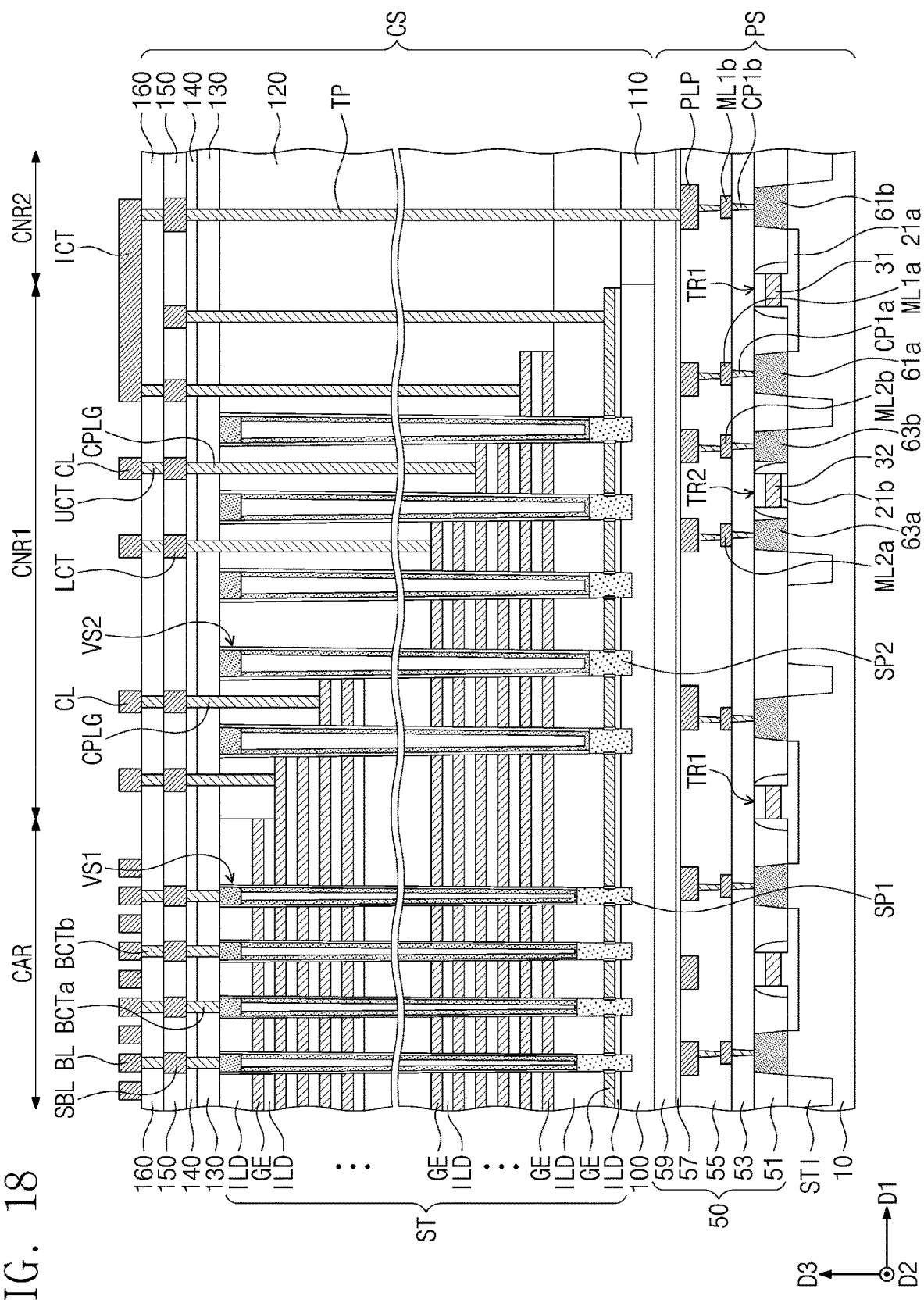
FIGS. 18 to 22 are sectional views illustrating a semiconductor device according to an embodiment of the inventive concept.
Figure 19:
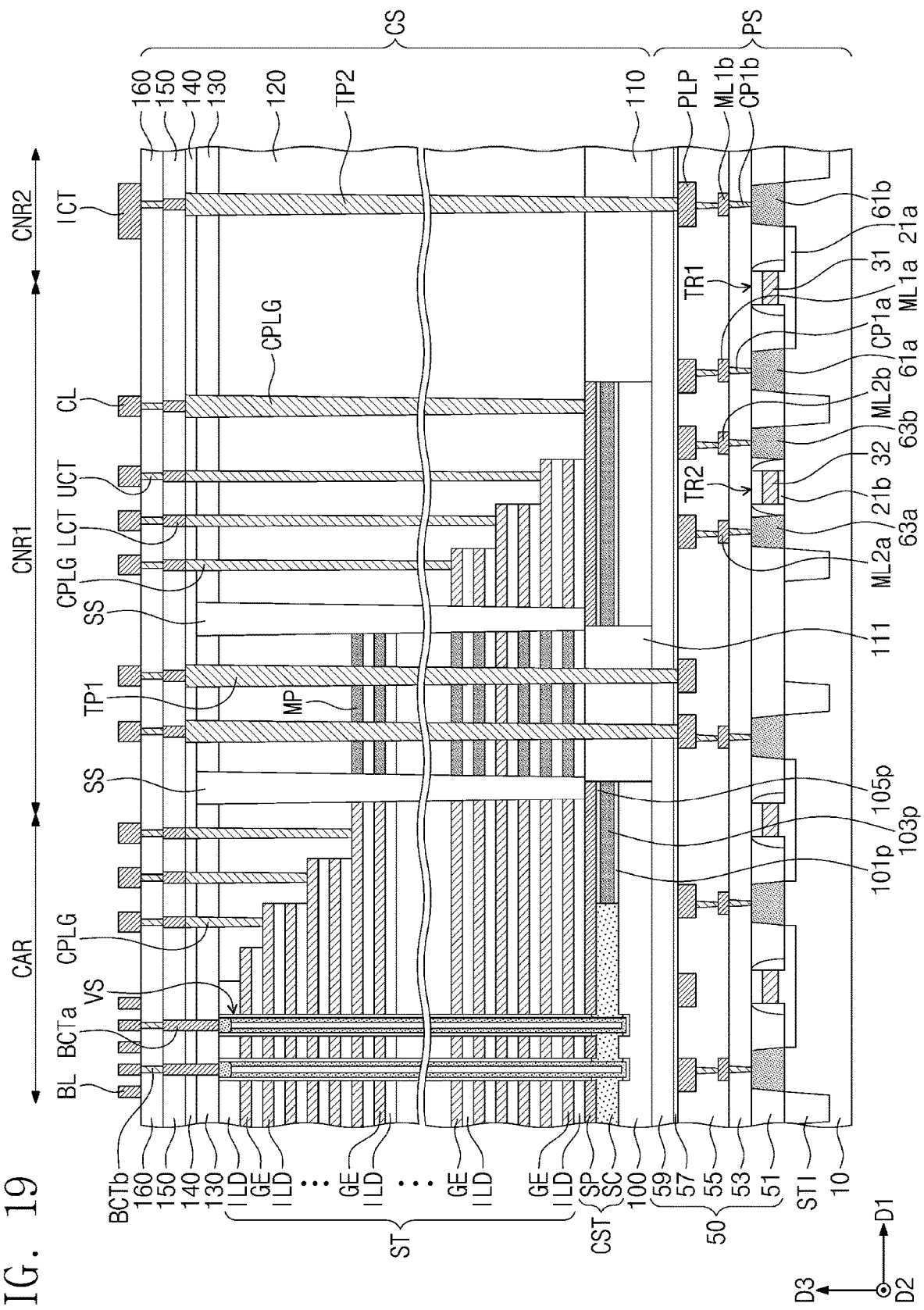
Figure 20:
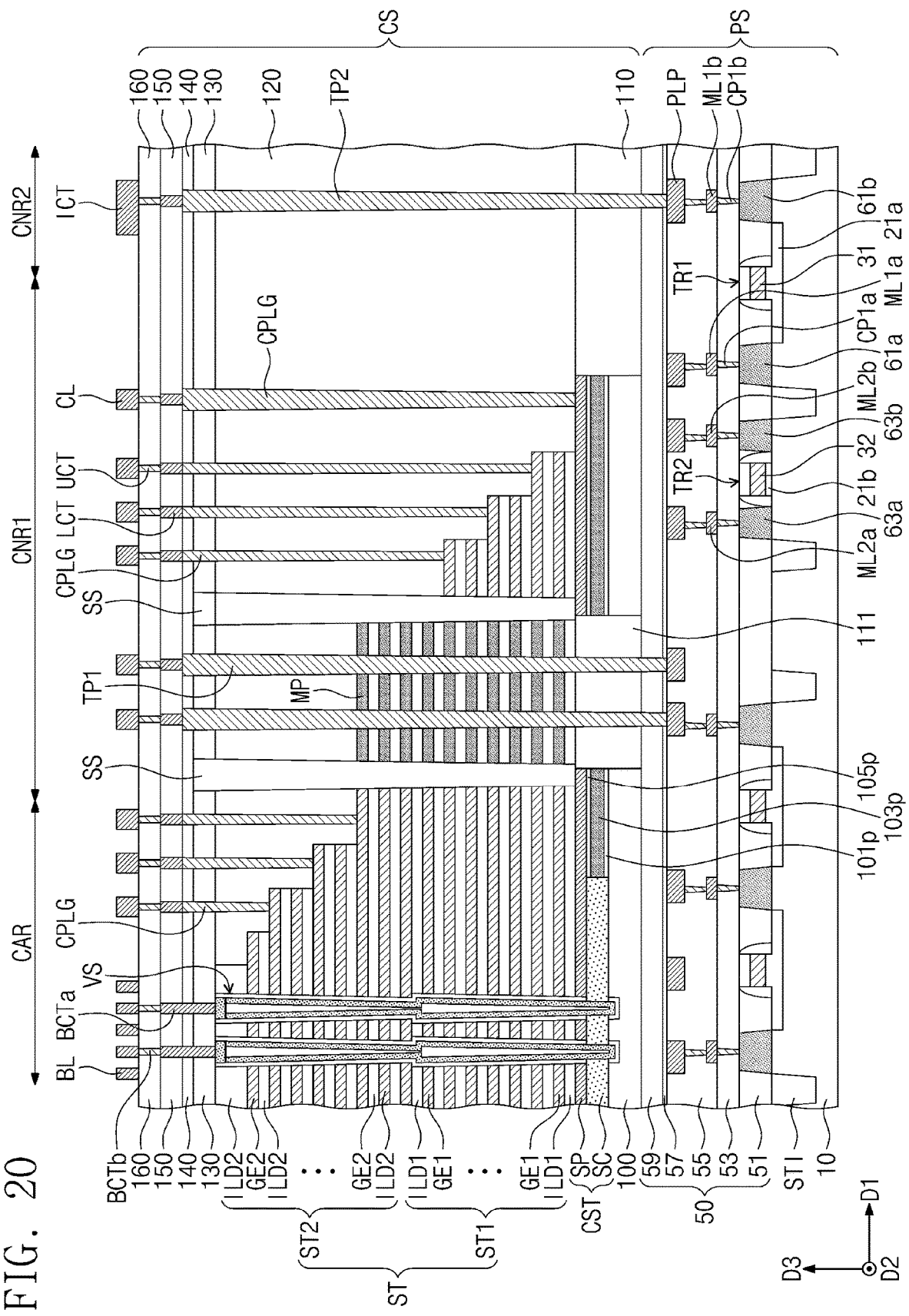

FIGS. 18 to 20 are sectional views illustrating a semiconductor device according to an embodiment of the inventive concept.

In the embodiment shown in FIG. 18, a semiconductor device may include the peripheral circuit structure PS and the cell array structure CS on the peripheral circuit structure PS.

The peripheral circuit structure PS may include peripheral circuits, which are integrated on the semiconductor substrate 10, and a lower insulating layer 50, which is provided to cover the peripheral circuits.

The peripheral circuits may include the row and column decoders, the page buffer, the voltage generator, the control circuit, and so forth, which are integrated on the semiconductor substrate 10. In more detail, the peripheral circuits may include the high- and low-voltage transistors TR1 and TR2. The high-voltage transistors TR1 may have substantially the same features as the transistors previously described with reference to FIGS. 7 to 16. For example, the high-voltage transistors TR1 of the peripheral circuit structure PS may include the first gate insulating pattern 21a and the first gate electrode 31, which are provided on the semiconductor substrate 10, and the first and second epitaxial layers 61a and 61b, which are provided at opposite sides of the first gate electrode 31. Here, top surfaces of the first and second epitaxial layers 61a and 61b may be located at a level higher than bottom and top surfaces of the first gate electrode 31.

In an embodiment, the second epitaxial layer 61b of the high-voltage transistor TR1 may be electrically connected to electrodes GE, which are used as the word lines in the cell array structure CS. The high-voltage transistors TR1 of the peripheral circuit structure PS may constitute a part of the page buffer and may be electrically connected to the bit lines BL.

The low-voltage transistors TR2 may have substantially the same features as the transistors on the second transistor region previously described with reference to FIGS. 13 to 16. For example, the low-voltage transistors TR2 of the peripheral circuit structure PS may include the second gate electrode 32 on the semiconductor substrate 10, the second gate insulating pattern 21b between the second gate electrode 32 and the semiconductor substrate 10, and the third and fourth epitaxial layers 63a and 63b at opposite sides of the second gate electrode 32. Here, a thickness of the second gate insulating pattern 21b may be smaller than a thickness of the first gate insulating pattern 21a. In addition, top surfaces of the third and fourth epitaxial layers 63a and 63b may be located at a level higher than bottom and top surfaces of the second gate electrode 32. In an embodiment, the third and fourth epitaxial layers 63a and 63b may be omitted.

The lower insulating layer 50 may be provided on the semiconductor substrate 10. The lower insulating layer 50 may include a plurality of stacked interlayer insulating layers. For example, the lower insulating layer 50 may include a silicon oxide layer, a silicon nitride layer, a silicon oxynitride layer, and/or a low-k dielectric layer. In an embodiment, the lower insulating layer 50 may include first to fourth interlayer insulating layers 51, 53, 55, and 59, which are sequentially stacked, and an etch stop layer 57, which is interposed between the third and fourth interlayer insulating layers 55 and 59. The etch stop layer 57 may be formed of or include an insulating material different from the third and fourth interlayer insulating layers 55 and 59 and may cover top surfaces of the uppermost ones of peripheral interconnection lines PLP.

The first interlayer insulating layer 51 may be provided on the semiconductor substrate 10 to cover the first and second gate electrodes 31 and 32, and the first to fourth epitaxial layers 61a, 61b, 63a, and 63b may be disposed in the first interlayer insulating layer 51.

The second interlayer insulating layer 53 may be provided on the first interlayer insulating layer 51 to cover the top surfaces of the first to fourth epitaxial layers 61a, 61b, 63a, and 63b. The first and second contact plugs CP1a and CP1b may penetrate the second interlayer insulating layer 53 and may be respectively coupled to the first and second epitaxial layers 61a and 61b of the high-voltage transistor TR1. The third and fourth contact plugs CP2a and CP2b may penetrate the second interlayer insulating layer 53 and may be respectively coupled to the third and fourth epitaxial layers 63a and 63b of the low-voltage transistor TR2. Furthermore, the first to fourth conductive lines ML1a, ML1b, ML2a, and ML2b may be provided on the second interlayer insulating layer 53 and may be coupled to the first to fourth contact plugs CP1a, CP1b, CP2a, and CP2b, respectively.

The peripheral interconnection lines PLP may be electrically connected to the high- and low-voltage transistors TR1 and TR2 through peripheral contact plugs.

The cell array structure CS may be disposed on the lower insulating layer 50. The cell array structure CS may include a cell array region CAR and first and second connection regions CNR1 and CNR2, and the first connection region CNR1 may be positioned between the cell array region CAR and the second connection region CNR2 in the first direction D1.

The cell array structure CS may include a semiconductor layer 100, stacks ST, and first and second vertical structures VS1 and VS2, cell contact plugs CPLG, penetration plugs TP, the bit lines BL, and cell conductive lines CL.

In an embodiment, the cell strings CSTR of FIG. 1 may be formed on the semiconductor layer 100. The stack ST and the first vertical structures VS1 may constitute the cell strings CSTR shown in FIG. 1.

The semiconductor layer 100 may be disposed on a top surface of the lower insulating layer 50. The semiconductor layer 100 may be formed of a semiconductor material, an insulating material, or a conductive material. The semiconductor layer 100 may be formed of or may include a doped semiconductor material of the first conductivity type (e.g., n-type) and/or an undoped or intrinsic semiconductor material. The semiconductor layer 100 may be formed to have one of polycrystalline, amorphous, and single-crystalline structures.

A buried insulating layer 110 may be disposed at the second connection region CNR2 to cover a side surface of the semiconductor layer 100. The buried insulating layer 110 may be in contact with the lower insulating layer 50.

The stack ST may be disposed on the semiconductor layer 100. The stack ST may include electrodes GE and insulating layers ILD, which are alternately stacked in a third direction D3 perpendicular to the top surface of the semiconductor layer 100.

The stack ST may be extended from the cell array region CAR to the first connection region CNR1 in the first direction D1 and may have a stepwise structure on the first connection region CNR1. Each of the electrodes GE may include a pad portion, which is provided at the first connection region CNR1 and may be in contact with at least one of the cell contact plugs CPLG. The structure of the stack ST is not limited to the stepwise structure and is variously changed.

The electrodes GE may be formed of or may include at least one of, for example, doped semiconductors (e.g., doped silicon and so forth), metals (e.g., tungsten, copper, aluminum, and so forth), conductive metal nitrides (e.g., titanium nitride, tantalum nitride, and so forth), and transition metals (e.g., titanium, tantalum, and so forth). The insulating layers ILD may include or may be formed of a silicon oxide layer and/or a low-k dielectric layer. In an embodiment, the semiconductor device may be a vertical-type NAND FLASH memory device, and in this case, the electrodes GE of the stack ST may be used as the gate lower lines LL1 and LL2, the word lines WL, and the gate upper lines UL1 and UL2 described with reference to FIG. 1.

A planarized insulating layer 120 may cover the pad portions of the stack ST having the stepwise structure. The planarized insulating layer 120 may have a substantially flat top surface. The planarized insulating layer 120 may include a single insulating layer or a plurality of stacked insulating layers. First to fourth upper insulating layers 130, 140, 150, and 160 may be sequentially stacked on the planarized insulating layer 120.

The first vertical structures VS1 may be provided at the cell array region CAR to penetrate the stack ST. The first vertical structures VS1 may be arranged in a specific direction or in a zigzag shape, when viewed in a plan view.

The second vertical structures VS2 may be provided at the first connection region CNR1 to penetrate the planarized insulating layer 120 and the stack ST. The second vertical structures VS2 may pass through the pad portions of the electrodes GE.

Each of the first and second vertical structures VS1 and VS2 may include a vertical semiconductor pattern and a data storage pattern enclosing a side surface of the vertical semiconductor pattern. The data storage pattern may include a tunnel insulating layer, a charge storing layer, and a blocking insulating layer, which constitute a data storage element of a NAND FLASH memory device.

A first semiconductor pillar SP1 may be provided between the first vertical structure VS1 and the semiconductor layer 100, and a second semiconductor pillar SP2 may be provided between the second vertical structure VS2 and the semiconductor layer 100.

The first and second semiconductor pillars SP1 and SP2 may be provided to penetrate the lowermost one of the electrodes GE constituting the stack ST. The first and second semiconductor pillars SP1 and SP2 may be in contact with the semiconductor layer 100 and may include epitaxial layers grown from the semiconductor layer 100. The first and second semiconductor pillars SP1 and SP2 may electrically connect the vertical semiconductor patterns of the first and second vertical structures VS1 and VS2 to the semiconductor layer 100. The first and second semiconductor pillars SP1 and SP2 may be formed of silicon (Si), but in an embodiment, they may be formed of or may include at least one of germanium (Ge), silicon germanium (SiGe), III-V semiconductor compounds, and II-VI semiconductor compounds.

The cell contact plugs CPLG may penetrate the first and second upper insulating layers 130 and 140 and the planarized insulating layer 120 and may be coupled to the pad portions of the electrodes GE, respectively. The smaller the distance to the cell array region CAR, the smaller the vertical lengths of the cell contact plugs CPLG. Top surfaces of the cell contact plugs CPLG may be substantially coplanar with each other. The cell conductive lines CL may be disposed on the fourth upper insulating layer 160 of the first connection region CNR1 and may be coupled to the cell contact plugs CPLG through lower and upper contact plugs LCT and UCT.

The bit lines BL may be disposed at the cell array region CAR and on the fourth upper insulating layer 160 to cross the stack ST. The bit lines BL may be electrically connected to the first vertical structures VS1 through lower and upper bit line contact plugs BCTa and BCTb.

The penetration plugs TP may be provided at the second connection region CNR2 to penetrate the first and second upper insulating layers 130 and 140, the planarized insulating layer 120, and the buried insulating layer 110 and may be coupled to the peripheral interconnection lines PLP. The penetration plugs TP may be horizontally spaced apart from the stack ST. The penetration plugs TP may be connected to the cell contact plugs CPLG through connection conductive patterns ICT. For example, the high-voltage transistor TR1 of the peripheral circuit structure PS may be electrically connected to the electrodes GE of the cell array structure CS through the penetration plugs TP, the connection conductive pattern ICT, and the cell contact plugs CPLG.

The semiconductor device in the embodiment of FIGS. 19 and 20 may include the peripheral circuit structure PS and the cell array structure CS, similar to the semiconductor device previously described with reference to FIG. 18. For concise description, the same element as the semiconductor device previously described with reference to FIG. 18 may be identified by the same reference number without repeating an overlapping description thereof.

Referring to FIG. 19, the peripheral circuit structure PS may include the high- and low-voltage transistors TR1 and TR2, as described above.

In the present embodiment, the cell array structure CS may further include a source structure CST between the semiconductor layer 100 and the stack ST.

The source structure CST may include a source conductive pattern SC and a conductive support pattern SP on the source conductive pattern SC. The source structure CST may be parallel to the top surface of the semiconductor layer 100 and may be extended parallel to the stack ST at the cell array region CAR.

The source conductive pattern SC may be disposed at the cell array region CAR and between the semiconductor layer 100 and the stack ST. The source conductive pattern SC may be formed of or may include a semiconductor material that is doped with dopants (e.g., phosphorus (P) or arsenic (As)) of a first conductivity type. In an embodiment, the source conductive pattern SC may be formed of a poly-silicon layer doped with n-type dopants.

The conductive support pattern SP may be provided to cover a top surface of the source conductive pattern SC at the cell array region CAR and to cover the topmost surface of dummy insulating patterns 101*p*, 103*p*, and 105*p* at the first connection region CNR1. The conductive support pattern SP may be formed of or may include a doped semiconductor material (e.g., of a first conductivity type or an n-type) and/or an intrinsic semiconductor material.

In an embodiment, a lower penetration insulating pattern 111 may be provided at the first connection region CNR1 to penetrate the source structure CST and the semiconductor layer 100. The lower penetration insulating pattern 111 may be in contact with the lower insulating layer 50.

The dummy insulating patterns 101*p*, 103*p*, and 105*p* may be disposed at the first connection region CNR1 and between the semiconductor layer 100 and the stack ST. The dummy insulating patterns 101*p*, 103*p*, and 105*p* may include first, second, and third insulating patterns 101*p*, 103*p*, and 105*p*, which are sequentially stacked on each other. The second insulating pattern 103*p* may be formed of or may include an insulating material that is different from the first and second insulating patterns 101*p* and 105*p*. The second insulating pattern 103*p* may be thicker than the first and second insulating patterns 101*p* and 105*p*. The first, second, and third insulating patterns 101*p*, 103*p*, and 105*p* may be formed of or may include at least one of silicon oxide, silicon nitride, silicon oxynitride, silicon carbide, and silicon germanium.

The buried insulating layer 110 may be disposed at the second connection region CNR2 to cover a side surface of the semiconductor layer 100 and a side surface of the source structure CST. The buried insulating layer 110 may be in contact with the lower insulating layer 50 and may have a top surface that is substantially coplanar with a top surface of the source structure CST.

In an embodiment, the stack ST may include mold patterns MP. The mold patterns MP which are provided at the first connection region CNR1 are located at the same level as some of the electrodes GE and are provided between the insulating layers ILD, respectively. The mold patterns MP may be formed of or may include an insulating material different from the insulating layers ILD. For example, the mold patterns MP may be formed of or may include at least one of silicon nitride, silicon oxynitride, and silicon germanium. The mold patterns MP may be closer to the cell array region CAR than the pad portions of the electrodes GE at the first connection region CNR1. The mold patterns MP may be overlapped with the lower penetration insulating pattern 111, when viewed in a plan view.

A vertical structure VS may be provided at the cell array region CAR to penetrate the stack ST and the source structure CST. The vertical structure VS may include a vertical semiconductor pattern whose side surface is in partial contact with the source conductive pattern SC.

A penetration insulating pattern SS may be provided at the first connection region CNR1 to penetrate a portion of the stack ST. The penetration insulating pattern SS may be provided between the electrodes GE and the mold patterns MP. The penetration insulating pattern SS may be provided to enclose the mold patterns MP, when viewed in a plan view. The penetration insulating pattern SS may include or may be formed of an insulating layer covering a side surface of the stack ST and side surfaces of the mold patterns MP. The penetration insulating pattern SS may be in contact with a top surface of the conductive support pattern SP and/or a top surface of the lower penetration insulating pattern 111.

First penetration plugs TP1 may be provided at the first connection region CNR1 to vertically penetrate the mold patterns MP and the lower penetration insulating pattern 111 of the stack ST and may be connected to the peripheral interconnection lines PLP. The first penetration plugs TP1 may be electrically connected to the cell contact plugs CPLG through the cell conductive lines CL.

Second penetration plugs TP2 may be provided at the second connection region CNR2 to penetrate the first and second upper insulating layers 130 and 140, the planarized insulating layer 120, and the buried insulating layer 110 and may be connected to the peripheral interconnection lines PLP.

In the embodiment shown in FIG. 20, the stack ST on the semiconductor layer 100 may include a first electrode structure ST1 and a second electrode structure ST2 on the first electrode structure ST1. The first electrode structure ST1 may include first electrodes EL1, which are stacked in a direction (i.e., the third direction D3) perpendicular to the semiconductor layer 100. The first electrode structure ST1 may further include first insulating layers ILD1, which are interposed between the stacked first electrodes ELI to vertically separate them from each other. In the first electrode structure ST1, the first insulating layers ILD1 and the first electrodes ELI may be alternately stacked on each other in the third direction D3. A second insulating layer ILD2 may be provided in the uppermost portion of the first electrode structure ST1.

The second electrode structure ST2 may include second electrodes EL2, which are stacked in the third direction D3 on the first electrode structure ST1. The second electrode structure ST2 may further include second insulating layers ILD2, which are interposed between the second electrodes EL2 to vertically separate them from each other. In the second electrode structure ST2, the second insulating layers ILD2 and the second electrodes EL2 may be alternately stacked on each other in the third direction D3.

Each of vertical structures VS may include a first vertical extended portion penetrating the first electrode structure ST1, a second vertical extended portion penetrating the second electrode structure ST2, and an extension portion between the first and second vertical extended portions. The extension portion may be provided in the uppermost one of the first insulating layers ILD1. A diameter of the vertical structure VS may be abruptly increased in the extension portion.

In the embodiments shown in FIGS. 18 to 20, the first and second epitaxial layers 61*a* and 61*b* serving as the source and drain terminals have top surfaces that are located at a level higher than the first gate electrode 31 of the high-voltage transistor TR1. It may be possible to secure a junction breakdown voltage margin for the high-voltage transistor TR1, even when an area of the peripheral circuit structure PS, along with the cell array structure CS, is reduced.

Figure 21:
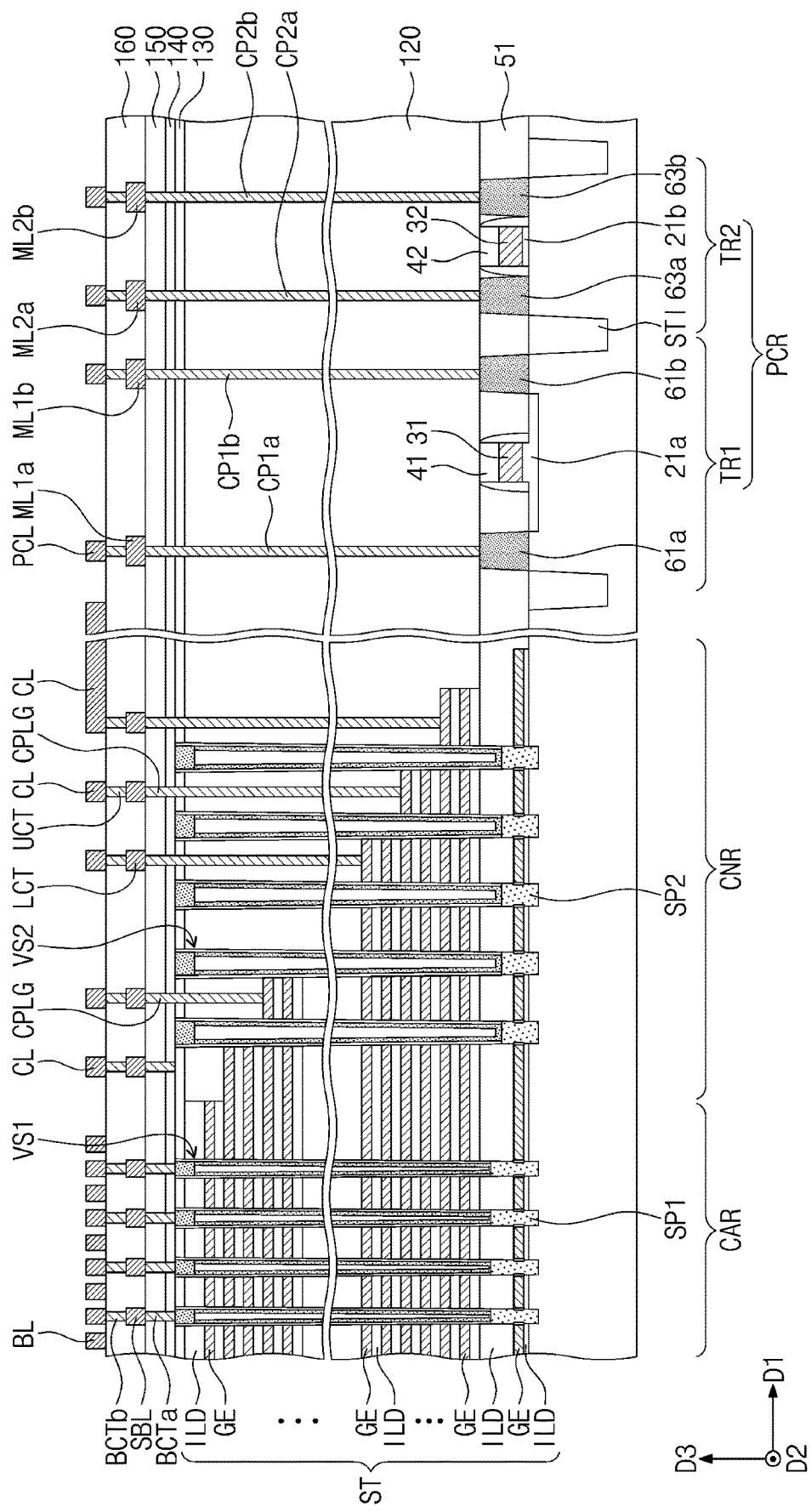

FIG. 21 is a sectional view illustrating a semiconductor device according to an embodiment of the inventive concept.

Referring to FIG. 21, the cell array structure CS may further include a peripheral circuit region PCR. The semiconductor substrate 10 may include a first region corresponding to the cell array region CAR and a second region corresponding to a peripheral circuit region PCR, which is provided around or near the first region of the cell array region CAR.

The stack ST may be provided on the first region of the semiconductor substrate 10 at the cell array region CAR, and the high- and low-voltage transistors TR1 and TR2 may be provided on the second region of the semiconductor substrate 10 at the peripheral circuit region PCR.

For example, the stack ST, the first and second vertical structures VS1 and VS2, the bit lines BL, and the cell contact plugs CPLG, and the cell conductive lines CL described with reference to FIG. 18 may be disposed on the first region of the semiconductor substrate 10 at the cell array region CAR.

The first and second gate electrodes 31 and 32 may be disposed on the second region of the semiconductor substrate 10 at the peripheral circuit region PCR, and the first to fourth epitaxial layers 61a, 61b, 63a, and 63b may be disposed on the semiconductor substrate 10.

The first to fourth contact plugs CP1a, CP1b, CP2a, and CP2b may be provided to penetrate the planarized insulating layer 120 and may be coupled to portions of the first to fourth epitaxial layers 61a, 61b, 63a, and 63b, respectively. The first to fourth contact plugs CP1a, CP1b, CP2a, and CP2b may be coupled to the first to fourth conductive lines ML1a, ML1b, ML2a, and ML2b, respectively, and the first to fourth conductive lines ML1a, ML1b, ML2a, and ML2b may be connected to peripheral conductive lines PCL, respectively.

Figure 22:
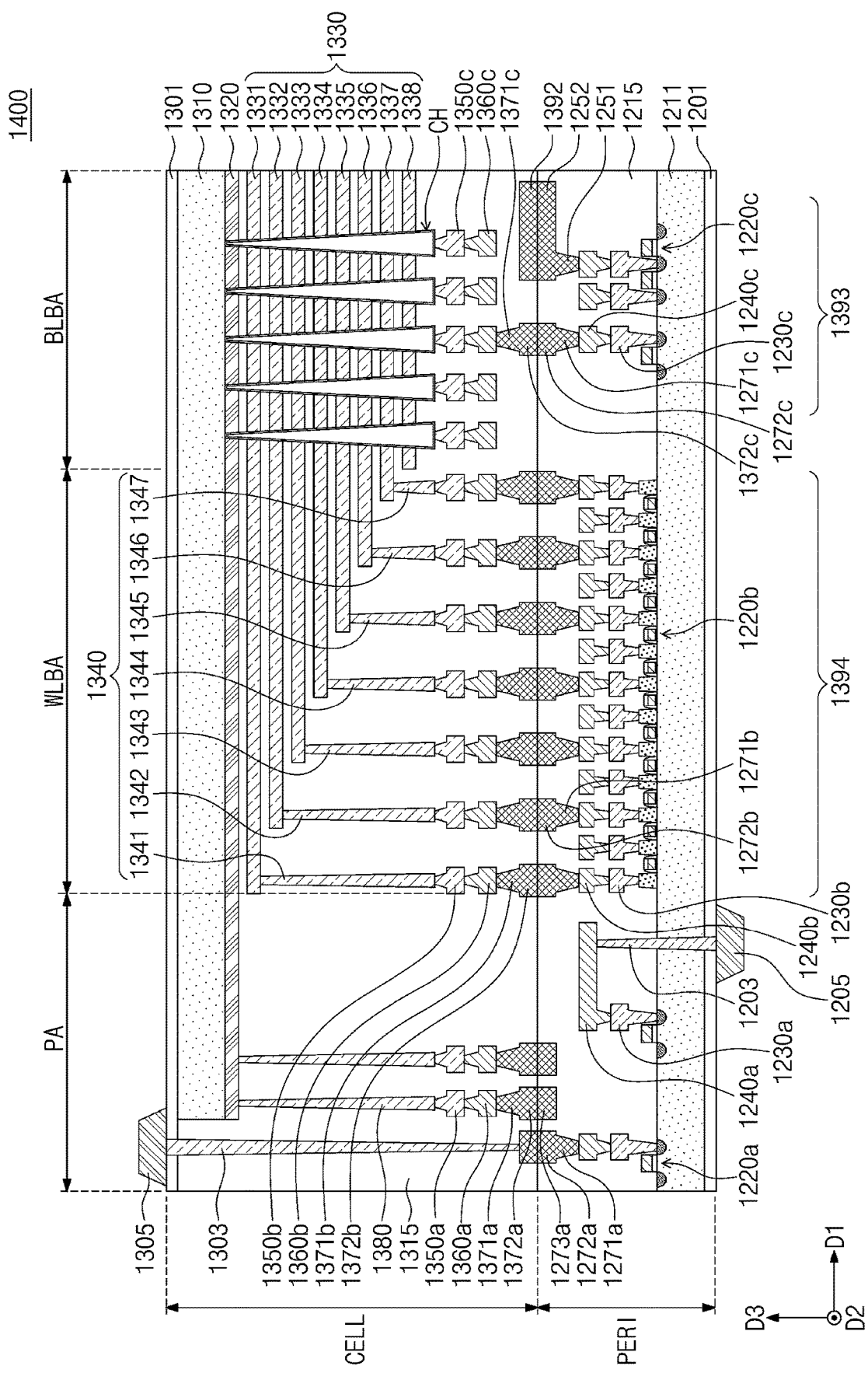

FIG. 22 is a sectional view illustrating a semiconductor device according to an embodiment of the inventive concept.

Referring to FIG. 22, a semiconductor device 1400 may be provided to have a chip-to-chip (C2C) structure. For the C2C structure, an upper chip including a cell array structure CELL may be fabricated on a first wafer, a lower chip including a peripheral circuit structure PERI may be fabricated on a second wafer different from the first wafer, and the upper chip and the lower chip may be connected to each other in a bonding manner. In the bonding manner, a bonding metal, which is formed in the uppermost metal layer of the upper chip, may be electrically connected to a bonding metal, which is formed in the uppermost metal layer of the lower chip. For example, in the case where the bonding metal is formed of copper (Cu), the bonding manner may be a Cu-to-Cu bonding manner, but in an embodiment, aluminum (Al) or tungsten (W) may be used as the bonding metal.

Each of the peripheral circuit structure PERI and the cell array structure CELL of the semiconductor device 1400 may include an outer pad bonding region PA, a word line bonding region WLBA, and a bit line bonding region BLBA.

The peripheral circuit structure PERI may include a first substrate 1211, an interlayer insulating layer 1215, a plurality of circuit devices 1220a, 1220b, and 1220c, which are formed at the first substrate 1211, first metal layers 1230a, 1230b, and 1230c, which are respectively connected to the circuit devices 1220a, 1220b, and 1220c, and second metal layers 1240a, 1240b, and 1240c, which are formed on the first metal layers 1230a, 1230b, and 1230c. In an embodiment, the first metal layers 1230a, 1230b, and 1230c may be formed of or may include a material (e.g., tungsten) having relatively high electric resistivity, and the second metal layers 1240a, 1240b, and 1240c may be formed of or may include a material (e.g., copper) having relatively low electric resistivity.

FIG. 22 illustrates only the first metal layers 1230a, 1230b, and 1230c and the second metal layers 1240a, 1240b, and 1240c, but in an embodiment, at least one metal layer may be further formed on the second metal layers 1240a, 1240b, and 1240c. At least one of the additional metal layers, which are formed on the second metal layers 1240a, 1240b, and 1240c, may be formed of a material (e.g., aluminum), which has lower electric resistivity than the material (e.g., copper) of the second metal layers 1240a, 1240b, and 1240c.

The interlayer insulating layer 1215 may be disposed on the first substrate 1211 to cover the circuit devices 1220a, 1220b, and 1220c, the first metal layers 1230a, 1230b, and 1230c, and the second metal layers 1240a, 1240b, and 1240c and may be formed of or may include at least one of insulating materials (e.g., silicon oxide and silicon nitride).

Lower bonding metals 1271b and 1272b may be formed on the second metal layer 1240b in the word line bonding region WLBA. In the word line bonding region WLBA, the lower bonding metals 1271b and 1272b of the peripheral circuit structure PERI may be electrically connected to upper bonding metals 1371b and 1372b of the cell array structure CELL in a bonding manner, and in an embodiment, the lower bonding metals 1271b and 1272b and the upper bonding metals 1371b and 1372b may be formed of or may include at least one of aluminum, copper, and tungsten.

The cell array structure CELL may include at least one memory block. The cell array structure CELL may include a second substrate 1310 and a common source line 1320. A plurality of word lines 1331-1338 (1330) may be stacked on the second substrate 1310 in a direction (e.g., a z-axis direction) that is perpendicular to a top surface of the second substrate 1310. String selection lines and a ground selection line may be respectively disposed on and below the word lines 1330, and the word lines 1330 may be disposed between the string selection lines and the ground selection line.

In the bit line bonding region BLBA, a channel structure CH may be provided to extend in the direction (e.g., the z-axis direction) perpendicular to a top surface of the second substrate 1310 and to penetrate the word lines 1330, the string selection lines, and the ground selection line. The channel structure CH may include a data storage layer, a channel layer, and a buried insulating layer, and in this case, a first metal layer 1350c and a second metal layer 1360c may be electrically connected to the channel layer. For example, the first metal layer 1350c may include the bit line contact plugs, and the second metal layer 1360c may include the bit lines. In an embodiment, the bit line 1360c may be extended in a first direction (e.g., a y-axis direction) parallel to the top surface of the second substrate 1310.

In an embodiment shown in FIG. 22, a region, in which the channel structure CH and the bit lines 1360c are provided, may be defined as the bit line bonding region BLBA. In the bit line bonding region BLBA, the bit lines 1360c may be electrically connected to the circuit devices 1220c, which constitute a page buffer 1393 of the peripheral circuit structure PERI. As an example, the bit lines 1360c may be connected to upper bonding metals 1371c and 1372c of the peripheral circuit structure PERI, and the upper bonding metals 1371c and 1372c may be connected to lower bonding metals 1271c and 1272c, which are connected to the circuit devices 1220c of the page buffer 1393.

In the word line bonding region WLBA, the word lines 1330 may be extended in a second direction (e.g., an x-axis direction), which is perpendicular to the first direction and is parallel to the top surface of the second substrate 1310, and may be connected to a plurality of cell contact plugs 1341-1347 (1340). The cell contact plugs 1340 may be connected to pads of the word lines 1330, which are extended in the second direction. A first metal layer 1350b and a second metal layer 1360b may be sequentially connected to upper portions of the cell contact plugs 1340 connected to the word lines 1330. In the word line bonding region WLBA, the cell contact plugs 1340 may be connected to the peripheral circuit structure PERI through the upper bonding metals 1371b and 1372b of the cell array structure CELL and the lower bonding metals 1271b and 1272b of the peripheral circuit structure PERI.

In the peripheral circuit structure PERI, the cell contact plugs 1340 may be electrically connected to the circuit devices 1220b constituting a row decoder 1394. In an embodiment, an operation voltage of the circuit devices 1220b constituting the row decoder 1394 may be different from an operation voltage of the circuit devices 1220c constituting the page buffer 1393. As an example, the operation voltage of the circuit devices 1220c constituting the page buffer 1393 may be higher than the operation voltage of the circuit devices 1220b constituting the row decoder 1394.

As an example, the circuit devices 1220b constituting the row decoder 1394 may include the transistors previously described with reference to FIGS. 7 to 16. As an example, the circuit devices 1220c constituting the page buffer 1393 may include the transistors previously described with reference to FIGS. 7 to 16.

A common source line contact plug 1380 may be disposed in the outer pad bonding region PA. The common source line contact plug 1380 may be formed of or may include at least one of conductive materials (e.g., metals, metal compounds, or polysilicon) and may be electrically connected to the common source line 1320. A first metal layer 1350a and a second metal layer 1360a may be sequentially stacked on the common source line contact plug 1380. The outer pad bonding region PA may be or may include a region, in which the common source line contact plug 1380, the first metal layer 1350a, and the second metal layer 1360a are provided.

Input/output pads 1205 and 1305 may be disposed in the outer pad bonding region PA. Referring to FIG. 22, a lower insulating layer 1201 may be formed below the first substrate 1211 to cover the bottom surface of the first substrate 1211, and the first input/output pad 1205 may be formed on the lower insulating layer 1201. The first input/output pad 1205 may be connected to at least one of the circuit devices 1220a, 220b, and 220c of the peripheral circuit structure PERI through a first input/output contact plug 1203 and may be separated apart from the first substrate 1211 by the lower insulating layer 1201. A sidewall insulating layer (not shown) may be disposed between the first input/output contact plug 1203 and the first substrate 1211 to electrically separate the first input/output contact plug 1203 from the first substrate 1211.

Referring to FIG. 22, an upper insulating layer 1301 may be formed on the second substrate 1310 to cover the top surface of the second substrate 1310, and the second input/output pad 1305 may be disposed on the upper insulating layer 1301. The second input/output pad 1305 may be connected to at least one of the circuit devices 1220a, 1220b, and 1220c of the peripheral circuit structure PERI through a second input/output contact plug 1303. In an embodiment, the second input/output pad 1305 may be electrically connected to the circuit device 1220a.

In certain embodiments, the second substrate 1310 and the common source line 1320 may be formed to be spaced apart from a region, in which the second input/output contact plug 1303 is provided. The second input/output pad 1305 may not be overlapped with the word lines 1330 in the third direction (e.g., the z-axis direction). Referring to FIG. 22, the second input/output contact plug 1303 may be spaced apart from the second substrate 1310 in a direction, which is parallel to the top surface of the second substrate 1310, to penetrate an interlayer insulating layer 1315 of the cell array structure CELL and may be connected to the second input/output pad 1305.

In certain embodiments, the first input/output pad 1205 and the second input/output pad 1305 may be provided optionally. As an example, the semiconductor device 1400 may include only the first input/output pad 1205, which is provided on the first substrate 1211, or to include only the second input/output pad 1305, which is provided on the second substrate 1310. Alternatively, the semiconductor device 1400 may include both of the first and second input/output pads 1205 and 1305.

A metal pattern provided in the uppermost metal layer of the cell array structure CELL or the peripheral circuit structure PERI may be used as a dummy pattern in each of the outer pad bonding region PA and the bit line bonding region BLBA. Alternatively, a metal pattern provided in the uppermost metal layer of the cell array structure CELL or the peripheral circuit structure PERI may be omitted.

The semiconductor device 1400 may include an upper metal pattern 1372a and a lower metal pattern 1273a, which are provided in the outer pad bonding region PA. The lower metal pattern 1273a may be formed in the uppermost metal layer of the peripheral circuit structure PERI to correspond to the upper metal pattern 1372a, which is formed in the uppermost metal layer of the cell array structure CELL, or to have the same shape as the upper metal pattern 1372a of the cell array structure CELL. The lower metal pattern 1273a of the peripheral circuit structure PERI and the upper metal pattern 1372a of the cell array structure CELL may overlap each other and may be connected to each other. The lower metal pattern 1273a, which is formed in the uppermost metal layer of the peripheral circuit structure PERI, may not be connected to any contact plug in the peripheral circuit structure PERI. In an embodiment, the upper metal pattern 1372a may be formed in the uppermost metal layer of the cell array structure CELL and in the outer pad bonding region PA to correspond to the lower metal pattern 1273a, which is formed in the uppermost metal layer of the peripheral circuit structure PERI, or to have the same shape as the lower metal pattern 1273a of the peripheral circuit structure PERI.

The lower bonding metals 1271b and 1272b may be formed on the second metal layer 1240b in the word line bonding region WLBA. In the word line bonding region WLBA, the lower bonding metals 1271b and 1272b of the peripheral circuit structure PERI may be electrically connected to the upper bonding metals 1371b and 1372b of the cell array structure CELL in a bonding manner.

Furthermore, in the bit line bonding region BLBA, an upper metal pattern 1392 may be formed in the uppermost metal layer of the cell array structure CELL to correspond to a lower metal pattern 1252, which is formed in the uppermost metal layer of the peripheral circuit structure PERI or to have the same shape as the lower metal pattern 1252 of the peripheral circuit structure PERI. In an embodiment, any contact plug may not be formed on the upper metal pattern 1392, which is formed in the uppermost metal layer of the cell array structure CELL.

According to an embodiment of the inventive concept, it may be possible to secure a breakdown voltage margin for high-voltage transistors, even when an occupying area of transistors constituting a peripheral circuit is reduced by an increase in integration density of a semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a gate electrode on a semiconductor substrate;
a gate insulating layer between the gate electrode and the semiconductor substrate;
an interlayer insulating layer on the semiconductor substrate to cover the gate electrode;
a first epitaxial layer disposed on the semiconductor substrate and at a first side of the gate electrode;
a second epitaxial layer disposed on the semiconductor substrate and at a second side, opposite to the first side, of the gate electrode;
a first contact plug in contact with a first portion of the first epitaxial layer; and
a second contact plug in contact with a first portion of the second epitaxial layer,
wherein a top surfaces of the first epitaxial layer and a top surface of the second epitaxial layer are located at a level higher than a top surface of the gate electrode, and
wherein the interlayer insulating layer has a top surface located at substantially the same level as the top surfaces of the first and second epitaxial layers.

2. The semiconductor device of claim 1, further comprising:
a device isolation layer, which is provided in the semiconductor substrate to define a plurality of active regions,
wherein the gate electrode, and the first and second epitaxial layers are provided on each of the plurality of active regions and are arranged in a first direction (D2), and
wherein the first and second epitaxial layers are disposed to be closer to the device isolation layer than the gate electrode in the first direction.

3. The semiconductor device of claim 2,
wherein the first and second epitaxial layers are spaced apart from each other in the first direction,
wherein the plurality of active regions include a first active region which has a first width in a second direction crossing the first direction, and
wherein each of the first and second epitaxial layers has a second width that is substantially equal to the first width of the first active region.

4. The semiconductor device of claim 1,
wherein an upper surface area of each of the first and second epitaxial layers is larger than an upper surface area of each of the first and second contact plugs.

5. The semiconductor device of claim 1,
wherein the first and second epitaxial layers have an impurity concentration higher than an impurity concentration of the semiconductor substrate.

6. The semiconductor device of claim 1,
wherein the first and second contact plugs penetrate the interlayer insulating layer to contact the first and second epitaxial layers, respectively.

7. The semiconductor device of claim 1, further comprising:
at least one block insulating pattern disposed in the semiconductor substrate between the first and second epitaxial layers.

8. The semiconductor device of claim 1,
wherein the first contact plug is provided in plural and the plurality of first contact plugs are connected to the first epitaxial layer, and
the second contact plug is provided in plural and the plurality of second contact plugs are connected to the second epitaxial layer.

9. The semiconductor device of claim 1, further comprising:
a low-voltage gate electrode provided on a low-voltage region of the semiconductor substrate;
a low-voltage gate insulating layer provided between the low-voltage gate electrode and the semiconductor substrate; and
third and fourth epitaxial layers provided at opposite sides of the low-voltage gate electrode,
wherein top surfaces of the third and fourth epitaxial layers are located at a level higher than a top surface of the low-voltage gate electrode.

10. A semiconductor device, comprising:
a peripheral circuit structure including a plurality of peripheral circuits integrated on a semiconductor substrate; and
a cell array structure disposed on the peripheral circuit structure, the cell array structure comprising a plurality of memory cells, which are three-dimensionally arranged on a semiconductor layer,
wherein the peripheral circuit structure comprises:
a device isolation layer provided in the semiconductor substrate to define an active region;
a gate electrode crossing the active region;
a gate insulating layer between the gate electrode and the semiconductor substrate;
a first impurity layer disposed at a first side of the gate electrode;
a second impurity layer disposed at a second side, opposite to the first side, of the gate electrode;
a first contact plug in contact with a portion of the first impurity layer; and
a second contact plug in contact with a portion of the second impurity layer, and
wherein top surfaces of the first and second impurity layers are located at a level higher than a top surface of the gate electrode.

11. The semiconductor device of claim 10,
wherein the gate electrode, and the first and second impurity layers are arranged in a first direction, and
wherein the first and second impurity layers are disposed to be closer to the device isolation layer than the gate electrode in the first direction.

12. The semiconductor device of claim 10,
wherein each of the first and second impurity layers comprises an epitaxial layer, which is disposed on a top surface of the semiconductor substrate.

13. The semiconductor device of claim 12,
wherein the epitaxial layers of the first and second impurity layers are spaced apart from each other, in a first direction, on the active region, wherein the active region has a first width in a second direction crossing the first direction, and wherein each of the epitaxial layers of the first and second impurity layers has a second width that is substantially equal to the first width of the active region.

14. The semiconductor device of claim 12, wherein an upper surface area of each of the epitaxial layers of the first and second impurity layers is larger than an upper surface area of each of the first and second contact plugs.

15. The semiconductor device of claim 10, wherein the semiconductor substrate has a recess region, which is defined in a portion of the active region, wherein the gate electrode is disposed in the recess region, and wherein the first and second impurity layers are provided in the semiconductor substrate at opposite sides of the recess region.

16. The semiconductor device of claim 10, further comprising:

a low-voltage gate electrode provided on a low-voltage region of the semiconductor substrate;

a low-voltage gate insulating layer provided between the low-voltage gate electrode and the semiconductor substrate; and third and fourth impurity layers at opposite sides of the low-voltage gate electrode, wherein top surfaces of the third and fourth impurity layers are located at a level higher than a top surface of the low-voltage gate electrode.

17. The semiconductor device of claim 10, wherein the cell array structure comprises a stack including a plurality of word lines vertically stacked on each other, a plurality of vertical structures penetrating the stack, and a plurality of bit lines, which are provided to cross the stack and are connected to the plurality of vertical structures, and wherein the first contact plug is electrically connected to one of the plurality of word lines of the cell array structure.

18. The semiconductor device of claim 17, wherein the first and second impurity layers overlap the stack of the plurality of word lines.

19. An electronic system, comprising:

a semiconductor device comprising a peripheral circuit structure, a cell array structure on the peripheral circuit structure, and an input/output pad, the peripheral circuit structure including a plurality of peripheral circuits integrated on a semiconductor substrate, the cell array structure including a plurality of memory cells, which are three-dimensionally arranged on a semiconductor layer, and the input/output pad being electrically connected to at least one of the plurality of peripheral circuits; and a controller, which is electrically connected to the semiconductor device through the input/output pad and is configured to control the semiconductor device, wherein the peripheral circuit structure of the semiconductor device comprises:

a device isolation layer provided in the semiconductor substrate to define an active region;

a gate electrode crossing the active region;

a gate insulating layer between the gate electrode and the semiconductor substrate;

a first impurity layer disposed at a first side of the gate electrode;

a second impurity layer disposed at a second side, opposite to the first side, of the gate electrode;

a first contact plug in contact with a portion of the first impurity layer; and a second contact plug in contact with a portion of the second impurity layer, and wherein top surfaces of the first and second impurity layers are located at a level higher than a top surface of the gate electrode.

20. The electronic system of claim 19, wherein each of the first and second impurity layers comprises an epitaxial layer disposed on a top surface of the semiconductor substrate.

* * * * *